(12) United States Patent
Abu Qahouq et al.

(10) Patent No.: US 7,692,329 B2
(45) Date of Patent: Apr. 6, 2010

(54) CURRENT SHARING FOR MULTIPHASE POWER CONVERSION

(75) Inventors: Jaber Abu Qahouq, Beaverton, OR (US); Lilly Huang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 400 days.

(21) Appl. No.: 11/710,103

(22) Filed: Feb. 23, 2007

(65) Prior Publication Data
US 2008/0204098 A1 Aug. 28, 2008

(51) Int. Cl.
*H02J 3/26* (2006.01)
(52) U.S. Cl. .................................................. 307/14
(58) Field of Classification Search ............... 307/14, 307/52, 19, 20, 24, 29, 32, 53
See application file for complete search history.

(56) References Cited

U.S. PATENT DOCUMENTS

| 4,024,467 | A  | * | 5/1977 | Andrews et al. | 606/37 |
| 6,459,171 | B1 | * | 10/2002 | Leifer | 307/52 |
| 7,218,532 | B2 | * | 5/2007 | Choi et al. | 363/21.01 |
| 7,391,200 | B1 | * | 6/2008 | Khanna et al. | 323/349 |
| 2006/0113970 | A1 | * | 6/2006 | Stover et al. | 323/222 |
| 2006/0233699 | A1 | * | 10/2006 | Mills | 423/648.1 |

OTHER PUBLICATIONS

Jaber A. Abu Qahouq et al., "Highly Efficient VRM For Wide Load Range with Dynamic Non-Uniform Current Sharing*", Intel Corporation, Corporate Technology Group—Systems Technology Lab, 2006, 7 pages.
Jaber A. Abu Qahouq et al., "Novel Current Sharing Schemes for Multiphase Converters with Digital Controller Implementation*", Intel Corporation, Corporate Technology Group—Systems Technology Lab, 2006, 9 pages.
United States Patent Application, pending, not yet published, U.S. Appl. No. 11/633,700, filed Dec. 4, 2006, J. Qahouq et al.

* cited by examiner

*Primary Examiner*—Albert W Paladini
(74) *Attorney, Agent, or Firm*—Blakely, Sokoloff, Taylor & Zafman LLP

(57) ABSTRACT

Current sharing scheme based on input power and/or the power efficiency for a power stage with multiple phases and/or paralleled modules is described. According to the scheme, duty cycles of different phases/modules may be adaptively adjusted until the minimum input power and/or the maximum power efficiency is achieved. For certain input voltages, the minimum input power exists at the minimum total input current. Thus, input power and/or the input current may be used as an indicator of the maximized power efficiency of the power stage and hence be used to track the optimal current sharing ratio among the multiple phases/modules.

17 Claims, 24 Drawing Sheets

CURRENT SHARING FOR MULTIPHASE POWER CONVERSION

RELATED APPLICATION

This application is related to commonly assigned U.S. application Ser. No. 11/633,700, filed by Jaber A. Abu Qahouq, Lilly Huang, Doug Huard, and Allan Hallberg with an effective filing date of Dec. 4, 2006 and entitled "Current Sharing for Multiphase Power Conversion."

TECHNICAL FIELD

The inventions generally relate to current sharing for multiphase power conversion with multiple phases and/or paralleled modules.

BACKGROUND

Current sharing between multiphase and/or paralleled power stages for power conversion such as for voltage regulators (VR) has previously been implemented in ways that include sensing and power loss. Multiphase voltage converters generally require a current sharing loop to maintain equal or desired current sharing between phases or paralleled modules. Prior current sharing schemes are based on sensing each phase current to provide the current information to the current control loop.

Multiphase voltage converters today require a current sharing loop, in addition to the output voltage regulation feedback control, to achieve appropriate current sharing among all phases and to provide controllability and stability. Without the current sharing loop, the multiphase converters tend to be unstable and go to a "Runaway" condition where a few or only one phase carries all the load current while other phases either carry very small or negative current, which leads to very low conversion efficiency, unstable output voltage with degraded transient response, and in the worst scenario the malfunction (destruction) of a converter.

The current sharing in previous designs requires sensing of each phase current, which usually requires about five passive components (some of which incur power losses) for sensing circuitry and a conditioning amplifier. This implies, for example, about twenty passive components and four amplifiers for a four phase converter. Moreover, the performance of the current sharing loop largely depends on the sensing accuracy of each phase and typically requires complicated calibration procedures and additional development cost.

Previously implemented sharing schemes have disadvantages including the fact that they operate to generate a pre-set sharing ratio that is independent of a converter efficiency value, they are highly affected by the sensing accuracy of each phase, and/or they require large associated sensing circuitries and off-line calibration. Therefore, new efficiency based current sharing would be helpful to eliminate or reduce many disadvantages of conventional current sharing schemes.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Figure 1:
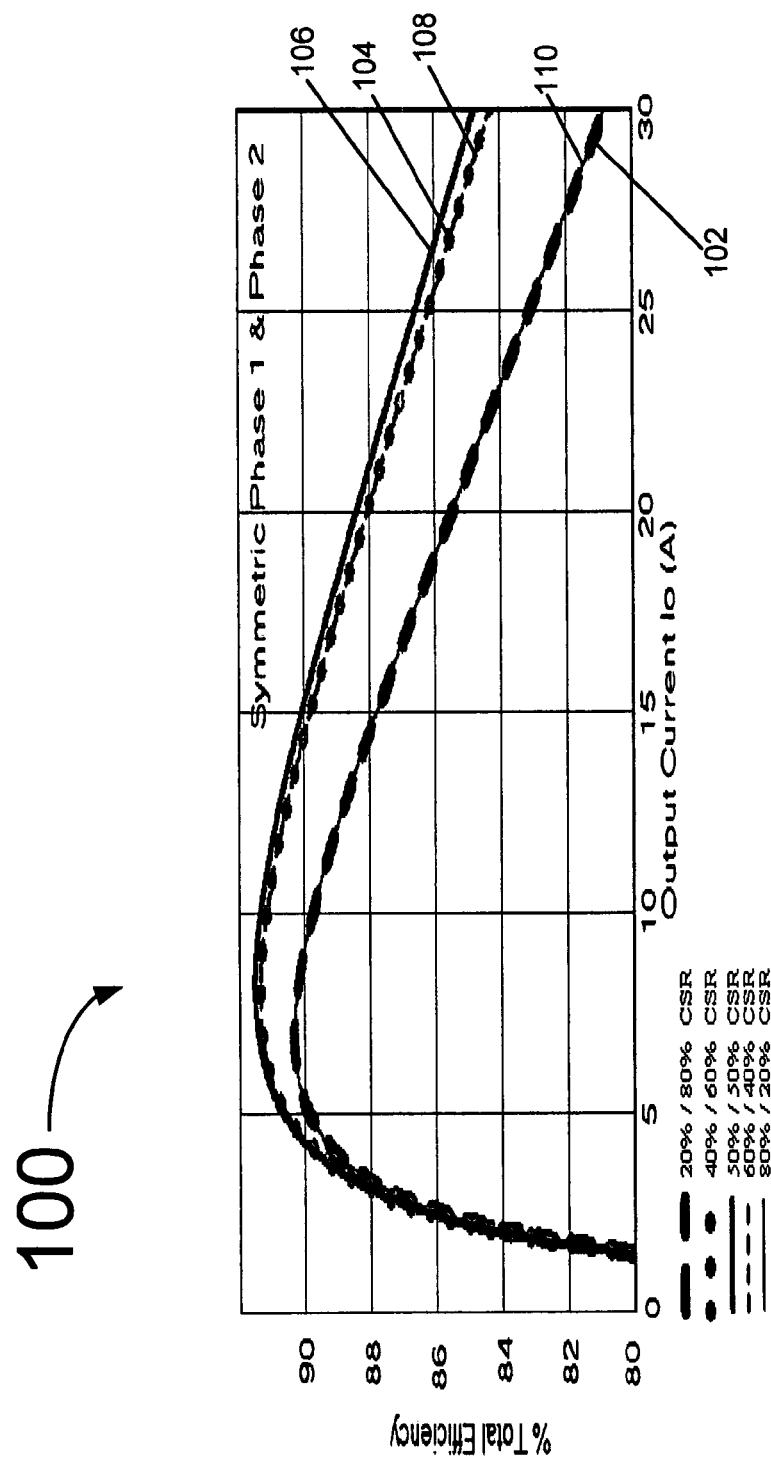
FIG. 1 illustrates an efficiency waveform according to some embodiments of the inventions.

Some embodiments of the inventions relate to current sharing for multiphase power conversion (and/or multiphase voltage converters and/or multiphase voltage regulators).

In some embodiments a difference between duty cycles of at least two different phases in a power conversion device is tracked, and current is shared between the at least two different phases in response to the dynamic tracking.

In some embodiments a difference between duty cycles of at least two different phases in a power conversion device is tracked with fewer sensors or without a sensor. According to some embodiments current is shared and adjusted on-the-fly between at least two different phases in response to the dynamic tracking and for the optimization on power efficiency of a converter. Additional applications of such methods or algorithms are also provided on calibration of current sharing of power conversion circuitry.

In some embodiments, the efficiency of a voltage converter is dynamically maximized (and losses are minimized) to achieve the optimum current sharing ratio. According to some embodiments, current sharing schemes may be implemented that are independent of sensing accuracy. According to some embodiments a reduced number of sensors and associated circuitry may be implemented (and/or an entire elimination of the number of sensors and associated circuitry may be implemented). According to some embodiments stand-alone current sharing schemes may be implemented to achieve on-line current sharing loop calibration. According to some embodiments current sharing schemes may be combined with conventional schemes to achieve on-line current sharing loop calibration. According to some embodiments, digital control may be implemented to perform current sharing, thus utilizing flexibility and other advantage associated with digital controllers.

According to some embodiments, current sharing control functionality between multiphase interleaved converters (and/or between paralleled modules of a power stage in general) is important in maintaining the appropriate amount of power handled by each phase. This is important in order to maintain expected design performance, thermal distribution, and to avoid converter malfunctioning. Most current sharing techniques are based on comparing phase currents after sensing them using one or more sensing methods. The difficulties and disadvantages of such techniques include a dependency on sensing accuracy, which may require calibration and is affected by sensing components (parasitic and aging). Such implementations require the design of a complicated loop with additional circuitries, and they may not result in optimum current sharing and/or optimum efficiency.

According to some embodiments, current sharing concepts may be used, resulting in several current sharing and online calibration schemes. Such sharing concepts according to some embodiments may be implemented such that their current sharing accuracy is not a function of sensing accuracy, and are thus immune to parasitic and aging of components. Such concepts do not necessarily require current sensing and comparison for each phase, are only based on efficiency maximization or loss minimization. Further, they can be used as stand alone current sharing concepts, or can be used for online lossless calibration in conjunction with existing current sharing schemes with no additional sensing or components added. According to some embodiments, an implementation may be used that does not require a sensor or additional current sensing.

According to some embodiments, current sharing may be implemented using a digital controller. Implementations using digital controllers are increasingly becoming practical and less costly, which make them more attractive because of their advantages including flexibility, ability to perform adaptive and estimative algorithms better than analog controllers, and simplified interface with digital systems.

According to some embodiments, there is no need for sensing phases' currents or any current in general. According to some embodiments the current sharing is achieved without sensing and without power loss. According to some embodiments current sharing is simply based on utilizing the power switches duty cycle value (which is available internally in the power stage controller to regulate the output voltage). It is based on dynamically tracking the maximum or minimum values of duty cycles, summation of all phases, and on dynamically tracking the minimum difference between duty cycles (depending on the power stage topology and the duty cycle definition within the controller). As current sharing ratio varies between phases, it has a well behaved bell shape curve, where the optimum current sharing ratio exists where the summation of the phases' duty cycles is maximum or minimum and where the minimum difference between duty cycles occurs. It naturally results in optimum current sharing between all phases, without additional sensors and sensing circuitries. Moreover, no sensing calibration is required since there isn't a negative impact due to sense mismatch.

In today's multiphase interleaved converters, which are used to supply power to processors and other chipsets, achieving current sharing between the paralleled phases or multiple channels impose technical challenges and design complexity especially as the number of paralleled phases (which are not exactly alike due to parasitic, aging, and process differences) increase for a supply with higher power.

According to some embodiments, in multiphase design with today's current sharing schemes accurate current sensing of each phase is required so that the current of each phase can be compared and utilized in the multiphase VR feedback control loop to balance the current in each phase and to provide loop stability. The current sharing in conventional technologies requires sensing each phase current, which usually requires about five passive components (some of which incur power losses) for sensing and a conditioning circuit amplifier, which results in approximately twenty passive components and four amplifiers for a four-phase converter. The performance of the current sharing loop largely depends on the sensing accuracy of each phase which requires calibration procedures that increase the development cost.

Sensing techniques can not guarantee accuracy because of the sensors and sensing circuitries with considerable characteristics. A slight difference in one phase sensing may result in a "run-away" phenomenon which causes some phases to carry a small current or no current at all. It would impose power stress on components associated with the other phases. This could then lead to VR degradation in efficiency and performance. In today's designs and implementation, tedious calibration of the current sharing loop is performed by hand (manually), but it can not account accurately for component aging.

Another drawback of existing current sharing and sensing techniques is the fact that they perform their function for the purpose of achieving equal current sharing between VR phases, and the current sharing loop does not take into account power efficiency and performance of a power converter.

According to some embodiments, the summation of phase duty cycles or the difference between duty cycles has a well behaved bell shape curve, where the optimum current sharing ratio exists where the minimum difference between duty cycles occurs. For some specific applications, the summation of the phases' duty cycles is maximum or minimum.

What this means is that we can achieve current sharing without sensing each phase current, without adding sensing components, without adding sensing power losses, and without depending on sensing accuracy. This results in reduced component count and smaller size, lower cost, better current sharing and stability, potentially better efficiency, and immunity against components differences and aging effects. The proposed scheme can be implemented for the On-Board power stage, on-package power stages, and on-die and integrated power stages.

According to some embodiments described herein a two phase example is used for simplicity, but the invention should not be limited thereto.

Figure 2:
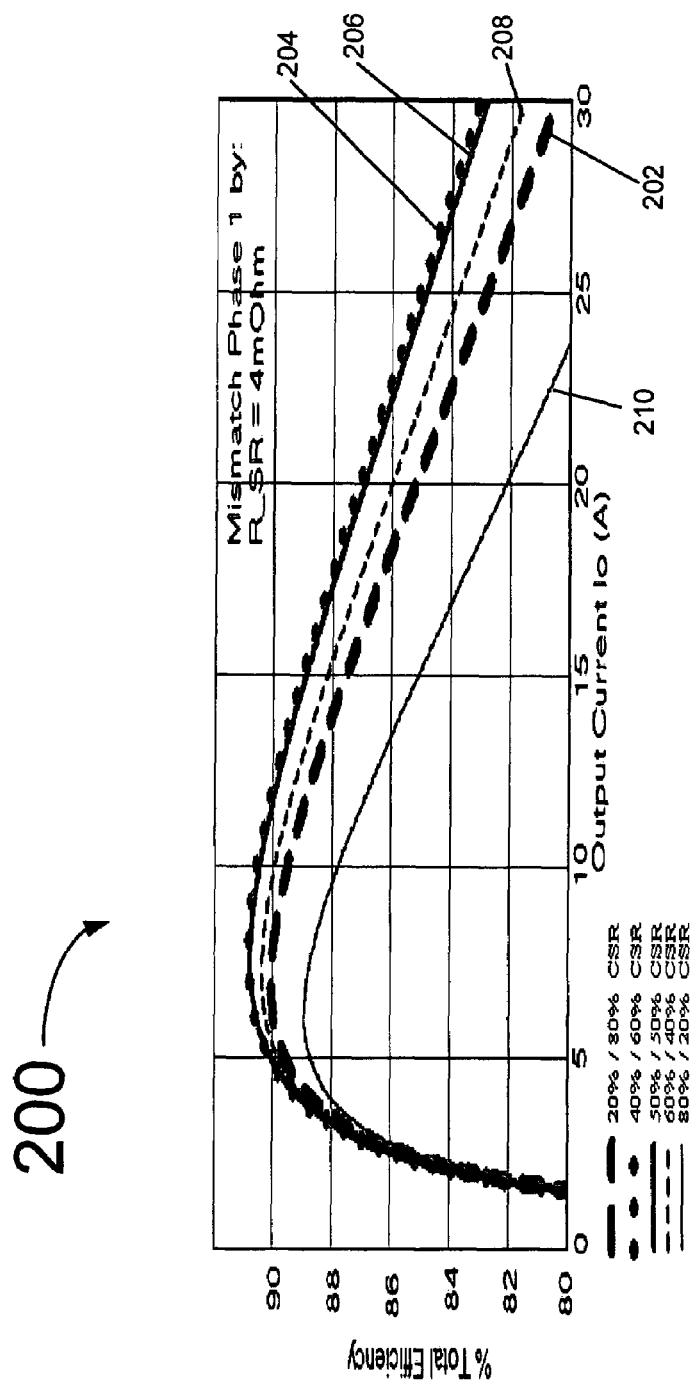
FIG. 2 illustrates an efficiency waveform according to some embodiments of the inventions.
Figure 3:
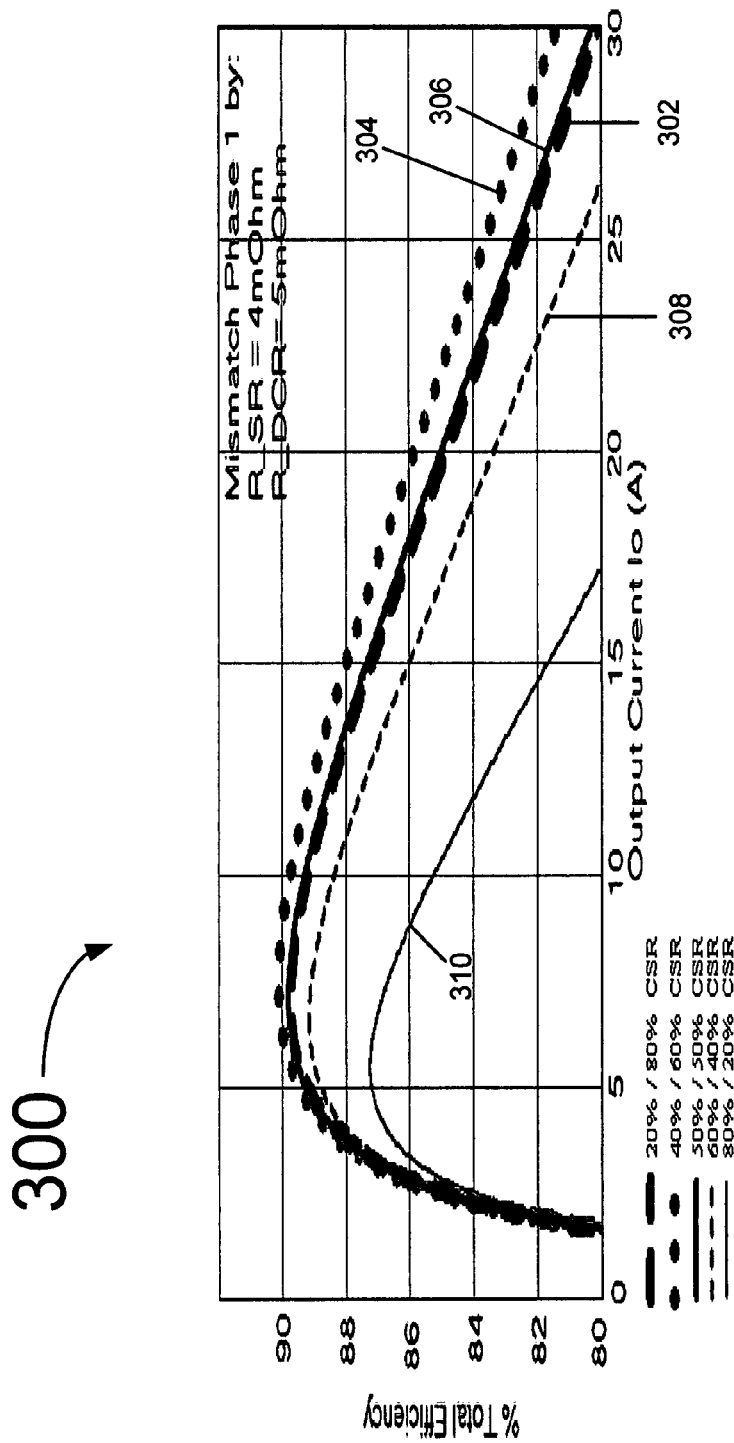
FIG. 3 illustrates an efficiency waveform according to some embodiments of the inventions.

FIGS. 1-3 illustrate power losses for multiphase buck converters considering most parasitic and losses including conduction losses, switching losses, and gate drive losses. FIGS. 1-3 illustrate an efficiency comparison at different current sharing ratios (CSRs) for a two-phase buck converter, FIG. 1 illustrating matched phases, and FIG. 2 and FIG. 3 illustrating mismatched phases. Parasitic considered include capacitances of all junctions and on-state resistances of FET (Field Effect Transistor) switches, output inductors DC (Direct Current) resistances, output capacitance equivalent series resistance, and trace resistances, for example. As a result of the losses modeling, a study may be made of the multiphase buck converter efficiency, input current/power, and duty cycle behaviors under various current sharing and operating conditions. For purposes of discussion, two buck converters are used. However, this should not be seen as any type of limitation since the same and/or similar results can be determined for higher numbers of phases.

Loss equations may be used herein to further provide analysis. A two phase buck converter with input voltage $V_{in}=12V$, output voltage $V_o=1V$ and full load current of $I_o=30$ A may be considered, for example. The design may be optimized with the following components: High-Side FET: IRF7821, low-side FET: IRF7832, $f_{sw}=300$ kHz, $L_o=0.45$ μH with DCR=5 mΩ, and gate drive of $V_{gs}=5V$. Trace resistances are assumed to be $R_{tr}=2$ mΩ.

FIG. 1 illustrates an efficiency plot 100 for a two phase design (assuming matched phases with no differences) at different Current Sharing Ratios (CSR) between the two phases, 20%/80% (Phase 1 carries 20% of the load current and Phase 2 carries 80%) plot 102, 40%/60% (Phase 1 carries 40% of the load current and Phase 2 carries 60%) plot 104, 50%/50% (Phase 1 carries 50% of the load current and Phase 2 carries 50%) plot 106, 60%/40% (Phase 1 carries 60% of the load current and Phase 2 carries 40%) plot 108, and 80%/20% (Phase 1 carries 80% of the load current and Phase 2 carries 20%) plot 110. It can be clearly noticed from FIG. 1 that the efficiency is higher for the 50%/50% current sharing ratio case 106 since the two phases are matched.

FIG. 2 illustrates an efficiency plot 200 for the same design and current sharing ratios except that one phase is mismatched with trace resistance of 4 mΩ (in series with the low side FET) compared to the other. The efficiency plot 200 includes a 20%/80% plot 202 (Phase 1 carries 20% of the load current and Phase 2 carries 80%), 40%/60% (Phase 1 carries 40% of the load current and Phase 2 carries 60%) plot 204, 50%/50% (Phase 1 carries 50% of the load current and Phase 2 carries 50%) plot 206, 60%/40% (Phase 1 carries 60% of the load current and Phase 2 carries 40%) plot 208, and 80%/20% (Phase 1 carries 80% of the load current and Phase 2 carries 20%) plot 210. Now, the efficiency is highest for the 40%/60% ratio plot 204 and 50%/50% ratio plot 206 (both cases efficiencies are close).

FIG. 3 illustrates an efficiency plot 300 in which the inductor DCR, the equivalent DC resistance of the inductor in series, is mismatched by 5 mΩ. The efficiency plot 300 includes a 20%/80% plot 302 (Phase 1 carries 20% of the load current and Phase 2 carries 80%), 40%/60% (Phase 1 carries 40% of the load current and Phase 2 carries 60%) plot 304, 50%/50% (Phase 1 carries 50% of the load current and Phase 2 carries 50%) plot 306, 60%/40% (Phase 1 carries 60% of the load current and Phase 2 carries 40%) plot 308, and 80%/20% (Phase 1 carries 80% of the load current and Phase 2 carries 20%) plot 310. Based on viewing FIG. 3 it is evident that the 40%/60% plot 304 has the best efficiency.

According to some embodiments, designs may consider optimizing each phase for different current ratios so that one phase has higher efficiencies for higher currents and the other phase has higher efficiencies for lower currents. For these designs also, the same conclusion can be drawn (that is, for example, if phase 1 efficiency was optimized to carry 21A out of the 30A and phase 2 efficiency is optimized for 9A, the best efficiency would be for the 70%/30% current sharing ratio).

Figure 4:
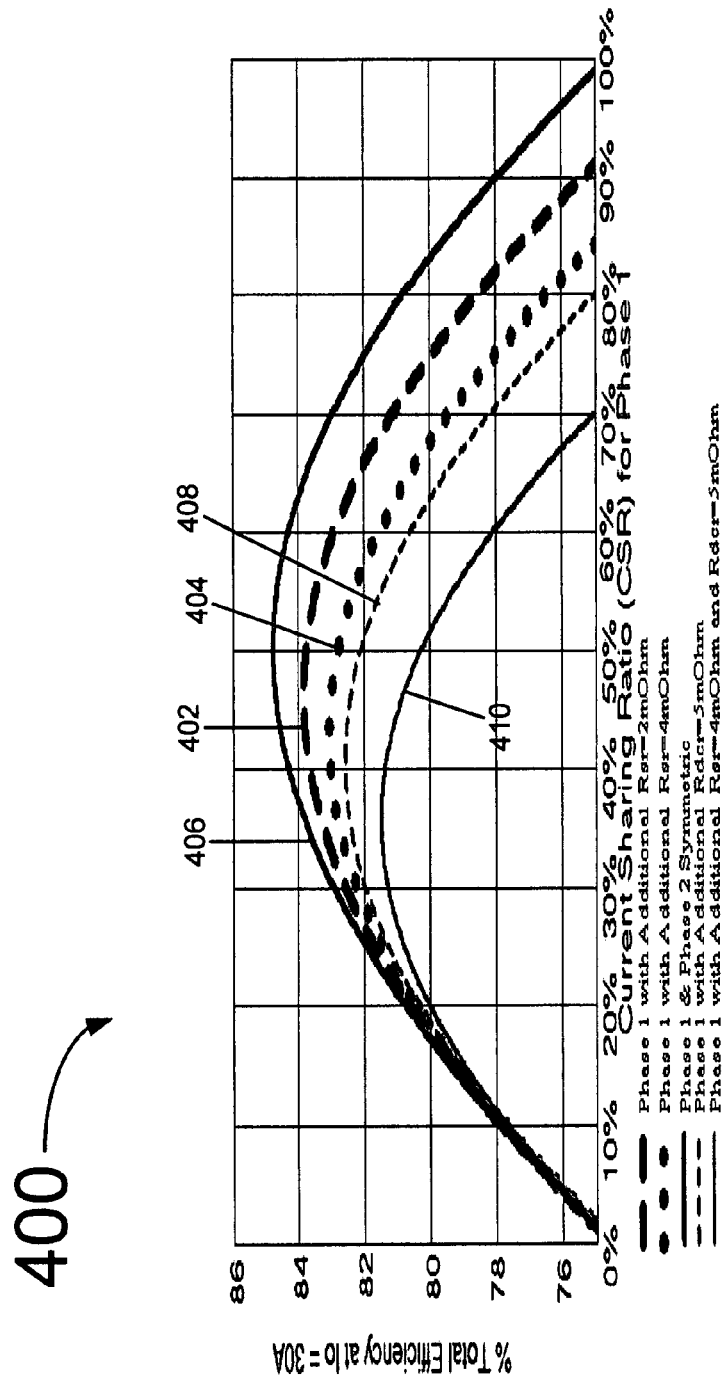
FIG. 4 illustrates a waveform according to some embodiments of the inventions.

FIG. 4 illustrates a plot 400 of conversion efficiency versus CSR at $I_o=30$ A for different cases of mismatching phases in their low FET Synchronous Rectifier Resistance ($R_{SR}$) and/or Inductor DCR ($R_{DCR}$) (the equivalent DC resistance of the inductor in series). Plot 400 includes several efficiency curves corresponding to the different design scenarios. They include phase 1 with additional synchronous rectifier resistance equal to 2 mOhm (plot 402), phase 1 with additional synchronous rectifier resistance equal to 4 mOhm (plot 404), phase 1 and phase 2 symmetric (plot 406), phase 1 with additional synchronous rectifier resistance of 5 mOhm (plot 408), and phase 1 with additional phase 1 synchronous resistance of 4 mOhm and inductor DCR of 5 mOhm. As is evident from FIG. 5, the best efficiency in each case exists at different values of CSR. It exists at 50%50% for the matched phase's case (plot 406) and it is different for other cases depending on the mismatching degree and type.

Figure 5:
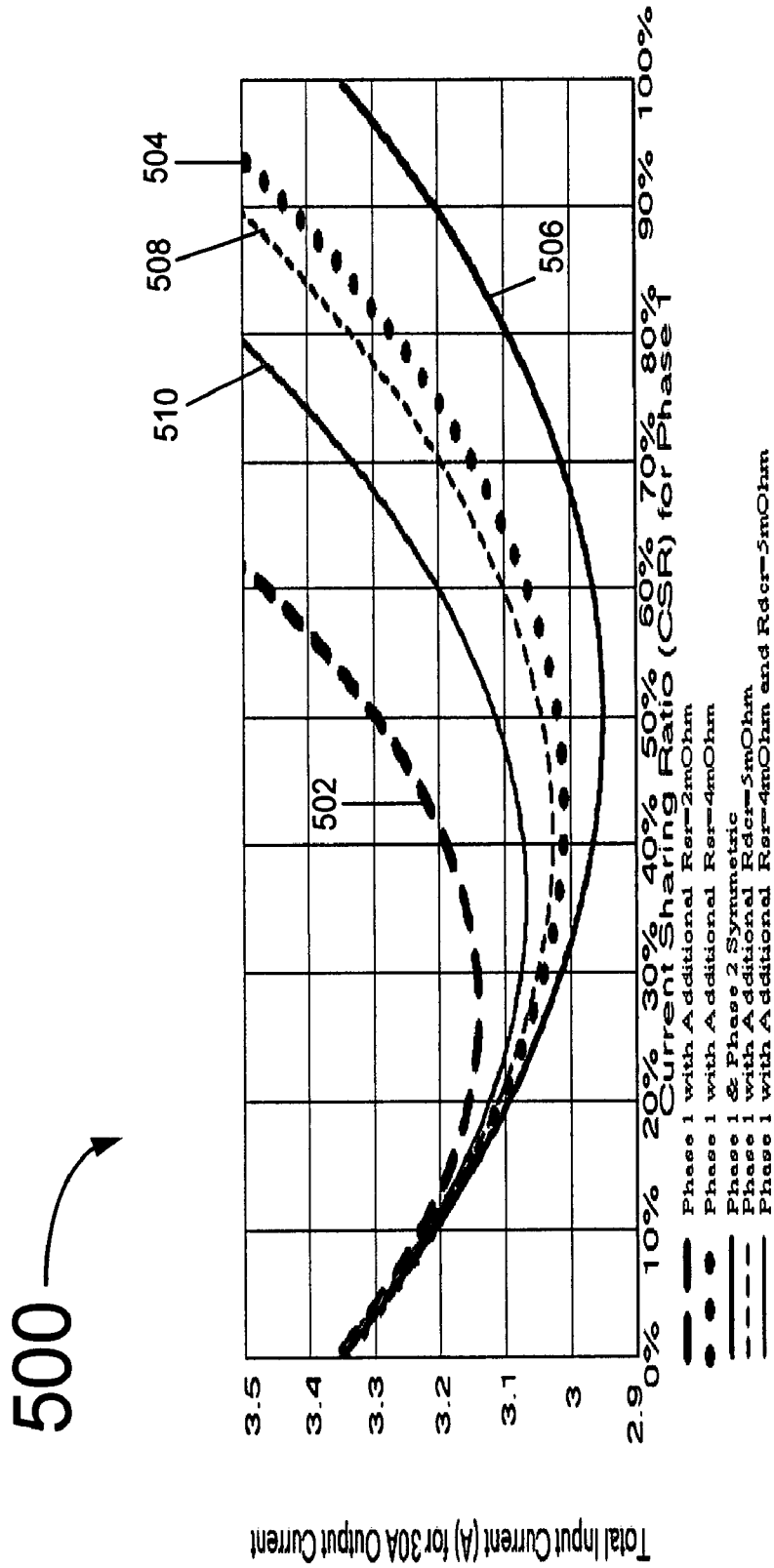
FIG. 5 illustrates a waveform according to some embodiments of the inventions.

FIG. 5 illustrates a plot 500 of Total Converter Input Current versus CSR at $I_o=30$ A for different cases of mismatching phases (as in FIG. 4). Plots 502, 504, 506, 508 and 510 generally correspond to similar phase plots as plots 402, 404, 406, 408 and 410, respectively. FIG. 5 illustrates that the minimum total input current exits at the maximum efficiency as expected. This fact is the base of an optimal current sharing for maximum power efficiency of a converter according to some embodiments and as described in further detail herein.

Figure 6:
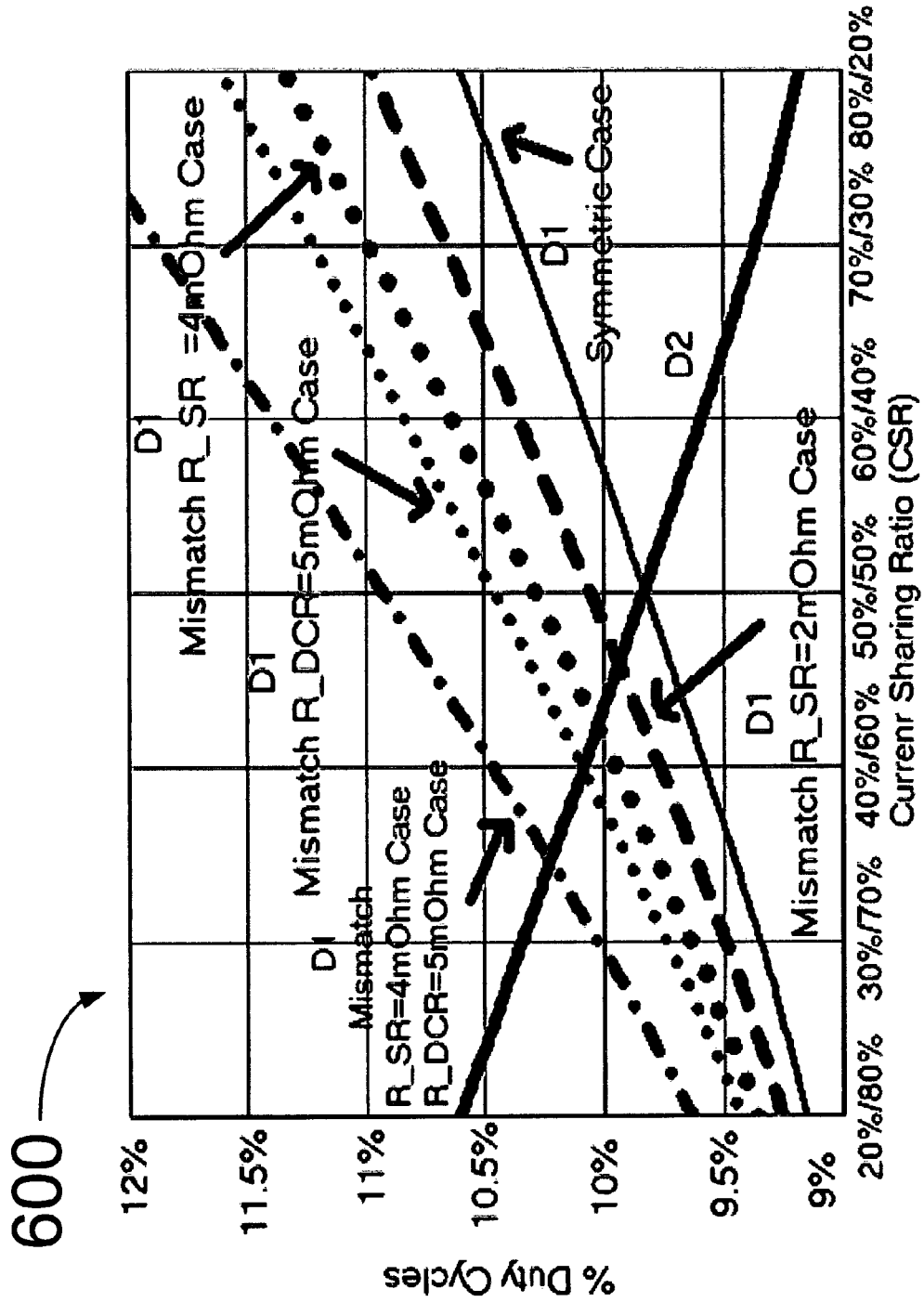
FIG. 6 illustrates a waveform according to some embodiments of the inventions.

FIG. 6 illustrates a plot 600 of Phases' Duty Cycles versus CSR at $I_o=30$ A for different cases of mismatching phases (as in FIG. 4). Plots 602, 604, 606, 608 and 610 generally correspond to similar phase plots as plots 402, 404, 406, 408 and 410, respectively. Phase 1 duty cycle is $D_1$, which changes as Phase 1 mismatch changes, and Phase 2 duty cycle is $D_2$ represented by the solid black line 612. Note that as the CSR increases for Phase 1, $D_1$ increases, and the increase in Phase 1 CSR means that Phase 2 CSR decreases which explains why $D_2$ (the solid black line 612) changes on the opposite direction of $D_1$.

FIG. 6 provides an interesting result and conclusion according to some embodiments. That is, the best conversion efficiency and lowest total input current exists at the point where the difference between the phases' duty cycles is the minimum. This observation is the base of current sharing according to some embodiments and as described in further detail herein.

According to some embodiments, it is recognized that the total converter input current or input power information are sufficient to achieve accurate and optimum current sharing at all conditions, independent of current sensing accuracy and with no need to sense each phase current. In addition, according to some embodiments a simpler control loop with reduced circuitry is required and sufficient. Moreover, such a solution can stand by itself, and can also be used along with conventional current sharing techniques to eliminate the drawback of required high sensing accuracy and calibration.

According to some embodiments, regardless whether converter phases are matched or not, one specific current sharing ratio exists that will give maximum efficiency for a load range condition. Maximum efficiency exists at the minimum input power value for a given output power. For certain input voltage values, the minimum input power exists at the minimum total input current value. Therefore, the input power and/or the input current can be used as an indication to the multiphase converter efficiency, and hence it can be used as an indication to the optimum current sharing ratio.

Figure 7:
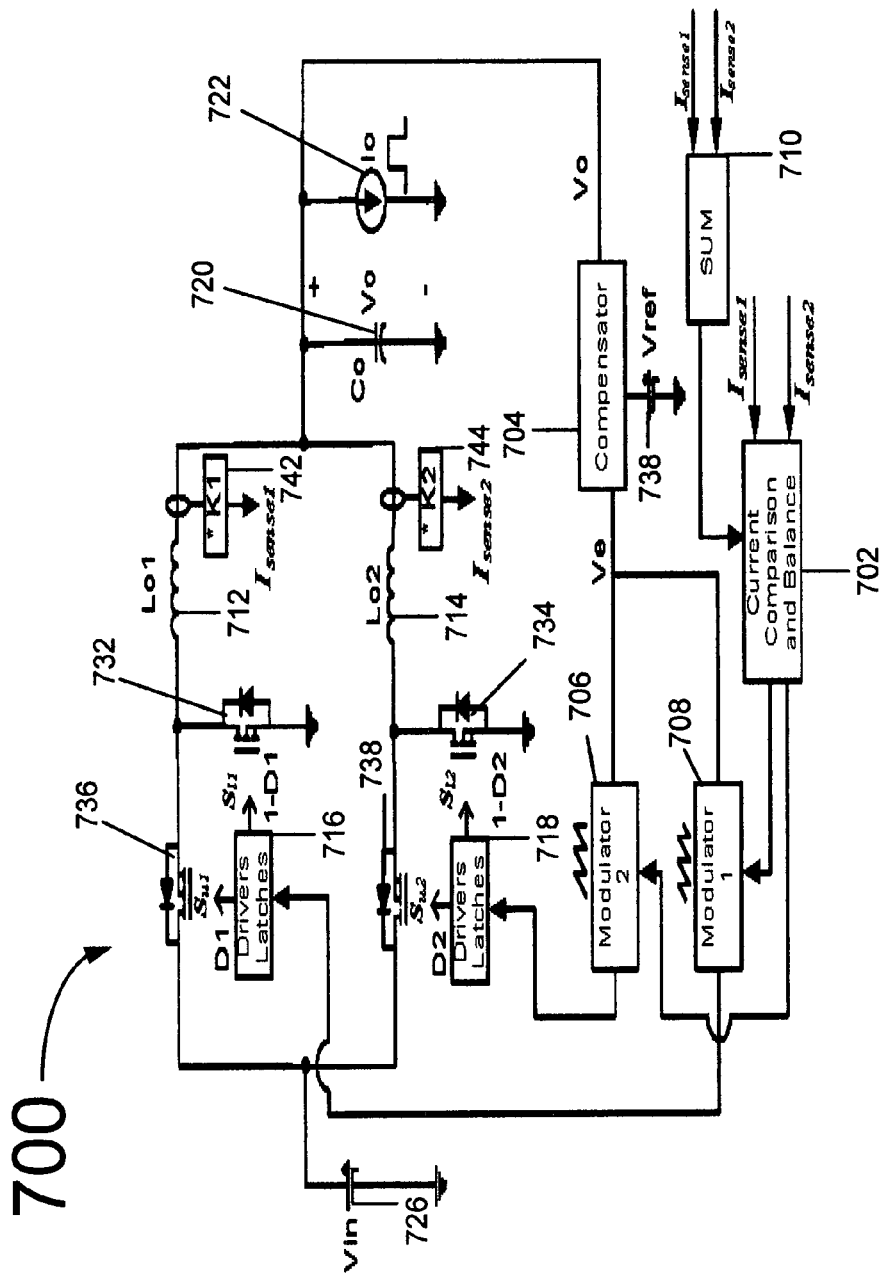
FIG. 7 illustrates a circuit according to some embodiments of the inventions.

FIG. 7 illustrates a current sharing circuit 700 where each phase current has to be sensed and then compared to a reference through a current sharing loop to generate each phase duty cycle that will result in the desired current sharing ratio (equal phase current sharing in this discussion). Several current sensing schemes may be used including inductor's DCR sensing schemes and FET on-resistance sensing schemes. The current sharing accuracy highly depends on the sensing accuracy for each phase, and therefore, the equal current sharing can not be guaranteed in any practical applications by conventional schemes without tedious calibration procedures.

Current sharing circuit 700 includes a control power switch 736 in phase 1, a control power switch 738 in phase2, a synchronous power switch 732 in phase 1, a synchronous power switch 734 in phase 2, a gate driver 716 to power switches in phase 1, a gate driver 718 to power switches in phase 2, an output inductor 712 in phase 1, an output inductor 714 in phase 2, a multiplier 742 or constant to scale current sense value for the output current in phase 1, a multiplier 744 or constant to scale current sense value for the output current in phase 2, a pulse width modulator 706 (PWM) for a voltage control loop for phase 1, a PWM 708 for a voltage control loop for phase 2, a compensator unit 704 for voltage control loop, a reference value 738 for voltage regulation of the power converter, a compensator 702 for current loop and current sharing between phase 1 and phase2, a summation unit 710 which adds currents from both phase 1 and phase 2, an output capacitor 720 of the power converter 700, a load 722 of the power converter, and a power source 726 which supplies input voltage and/or power to the power converter.

Figure 8:
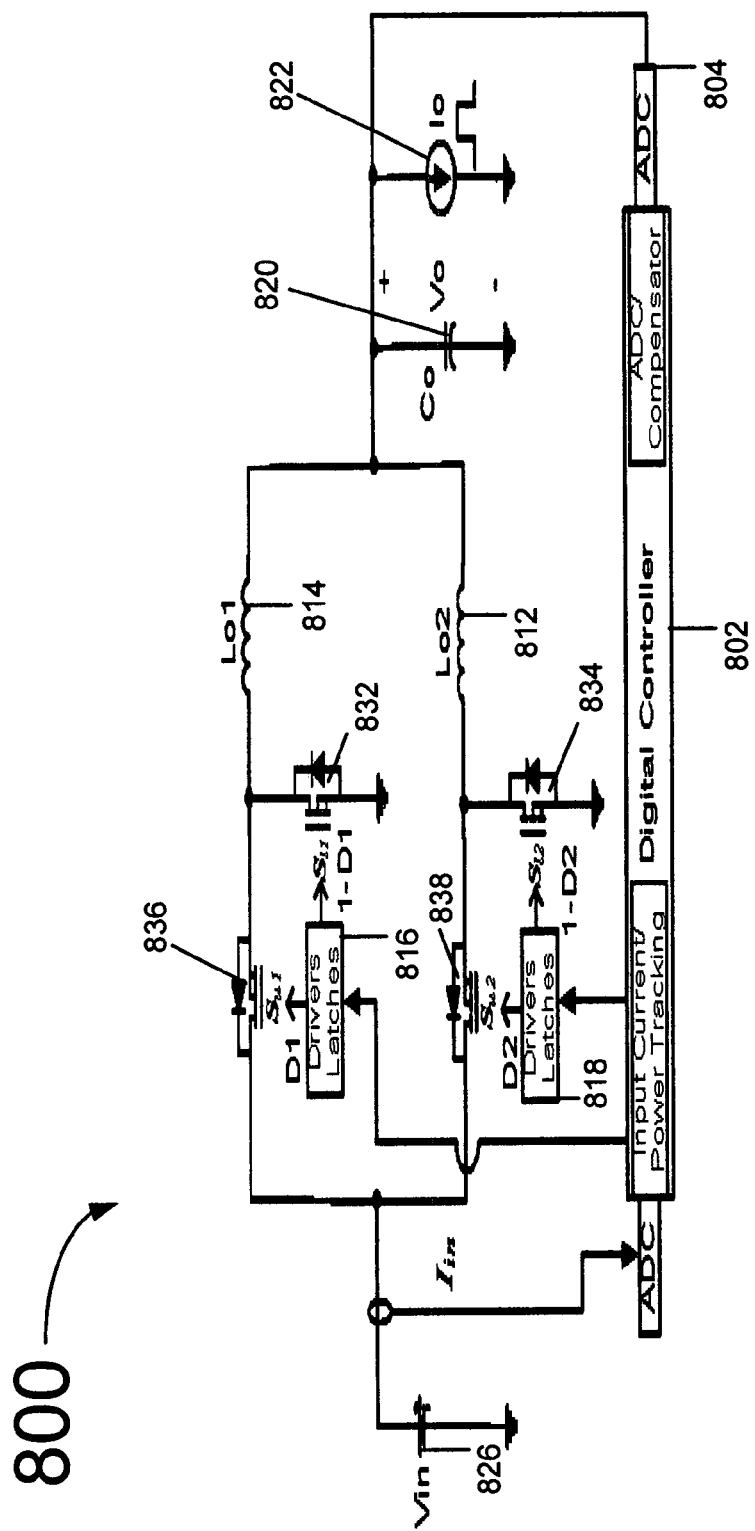
FIG. 8 illustrates a circuit according to some embodiments of the inventions.

FIG. 8 illustrates a current sharing implementation 800 according to some embodiments. Implementation 800 includes a digital controller 802 where the total input current/power of the multiphase converter is sensed (only one sense at the input and not N sensors for N phases as implemented in a conventional design). The input current/power is sampled by ADC (analog to digital conversion) 804 and is then fed to the digital controller 802, where it is used to modify the duty cycle of the PWM (Pulse Wave Modulation) signal of each phase to ensure accurate current sharing, which is achieved, for example, when the input current/power is minimum. Current sharing circuit 800 of FIG. 8 is, according to some embodiments, a two-phase buck power stage with an input power source 826 that delivers an output power to the load 822 after being processed by power conversion circuit 800. The power stage includes two-phase conversion circuitry. The first phase includes elements 836, 832, 814, and 816, and the second phase includes elements 838, 834, 812, and 818. Elements 836, 832, 838, and 834 are switches that are turned ON and OFF by certain sequences by the controller 802 through the buffers or latches (elements 816 and 818) to generate the required regulated energy at the output capacitor 820 to supply the load 822. The inductor elements 814 and 812 are used to store and deliver the energy to the load. The controller 802, which can be a processor, digital device, analog device, and/or other type of device, is utilized to implement current sharing algorithms (for example, current sharing algorithms as described herein). The ADC (Analog to Digital Converter) of element 804 is used to convert the sensed analog information to digital form so that it can be used by the controller 802 (for example, a digital controller).

Figure 9:
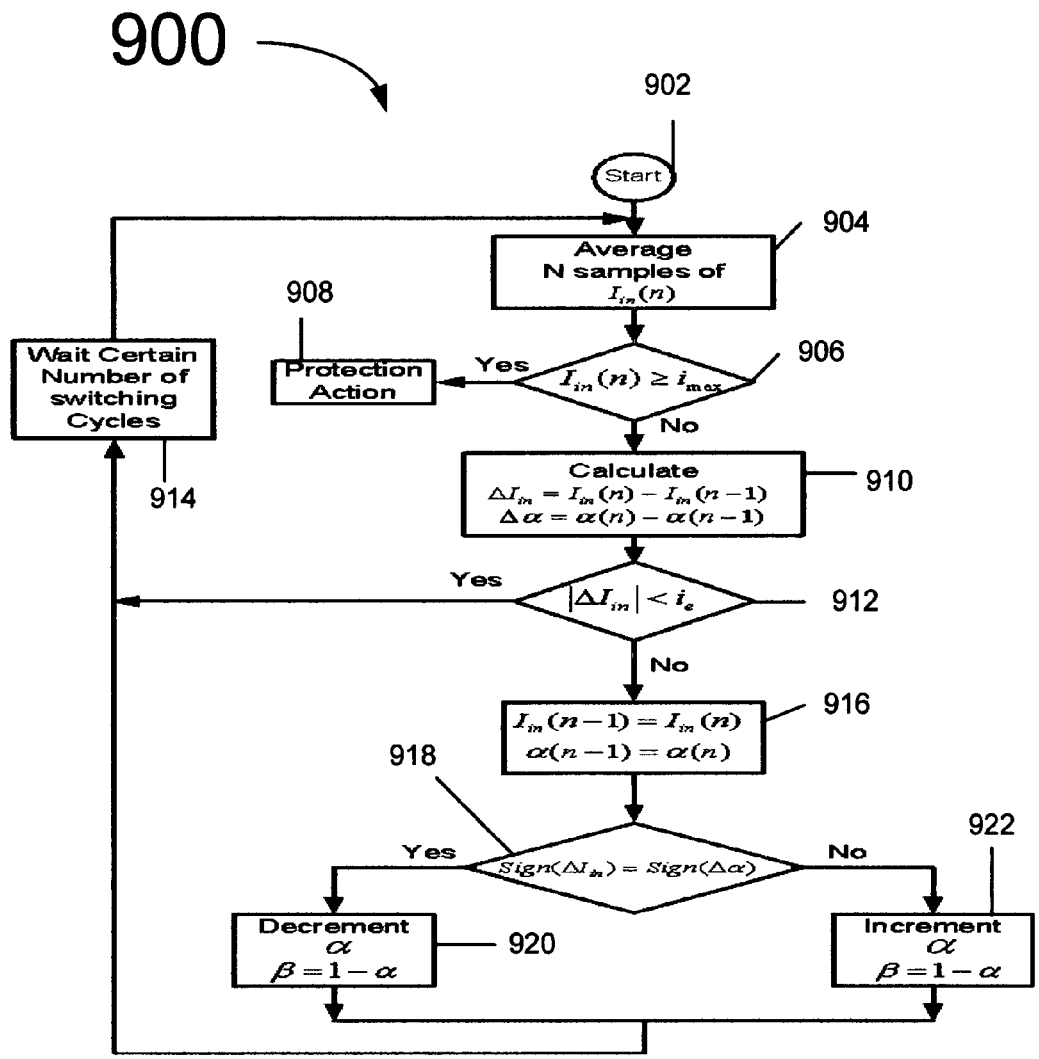
FIG. 9 illustrates a flow chart according to some embodiments of the inventions.

FIG. 9 illustrates a flow 900 according to some embodiments. According to some embodiments flow 900 may be implemented as part of a digital controller current sharing loop (for example, according to some embodiments, as implemented by digital controller 802 of FIG. 8).

The duty cycles of Phase 1 and Phase 2 can be written as:
The duty cycles of Phase 1 and Phase 2 can be written as:

$$D_1 = \alpha \cdot D_c, D_2 = \beta \cdot D_c, \alpha + \beta = 1 \text{ (or } \alpha + \beta = \text{constant)}, \beta = 1 - \alpha, \text{ where:}$$

$D_1$: is phase 1 duty cycle.
$D_2$: is phase 2 duty cycle.
$\alpha$ and $\beta$ are the respective current sharing ratio control constants which sum up to 1.0 or any other constant.
$D_c$ is the total duty cycle generated by the closed loop compensator.

The controller adjusts (increments and decrements) $\alpha$ and $\beta$ (Current Sharing Coefficients-CSC) until the minimum input current/power is achieved (maximum efficiency). The range that $\alpha$ and $\beta$ can vary in a wide range or can be limited if desired.

The value $i_e$ is an optional threshold that can be used to stop the tracking process if the change in the input current is not sufficient to change $\alpha$ and $\beta$.

The flow 900 illustrated in FIG. 9 starts at start 902 and moves to box 904, where N samples are averaged. At 906 a determination is made as to whether the average sample value is greater than or equal to a maximum value. If the answer at 906 is "yes" then a protection action 908 is implemented. If the answer at 906 is "no" then a change in $I_{in}$ and a change in a are calculated at 910. Then a determination is made at 912 as to whether the absolute value of the change in $I_{in}$ is less than a value $i_e$. If the answer at 912 is "yes" then a wait of a certain predetermined number of switching cycles is made at 914. If the answer at 912 is "no" then a new current value of $I_{in}$ and a new $\alpha$ value are calculated at 916. Then a determination is made at 918 as to whether a sign of the change in $I_{in}$ is equal to a sign of the change in $\alpha$. If the answer at 918 is "yes", then $\alpha$ is decremented at 920. If the answer at 918 is "no", then $\alpha$ is incremented at 922. Then flow moves to box 914 to wait a certain number of switching cycles.

Although flow 900 as illustrated in FIG. 9 tries to maximize efficiency of the power stage by minimizing the input current with the assumption that the input voltage remains relatively constant. In situations where the input voltage changes, the input power rather than the input current should be used and should be minimized by adaptively adjusting the duty cycles for the multiple phases or paralleled modules in the power stage. In another embodiment, the efficiency of the power stage may be used and the duty cycles of the multiple phases/paralleled modules may be adaptively adjusted to maximize the power stage efficiency. According to some embodiments and as discussed previously the optimum current sharing ratio for maximum efficiency exists where the difference between the phases' duty cycles is the minimum. Since the duty cycles' information is available internally to the controller, there is no need to sense any current, neither phase currents nor input current, to achieve the optimum current sharing ratio, resulting in a totally sensor less current sharing method.

Figure 10:
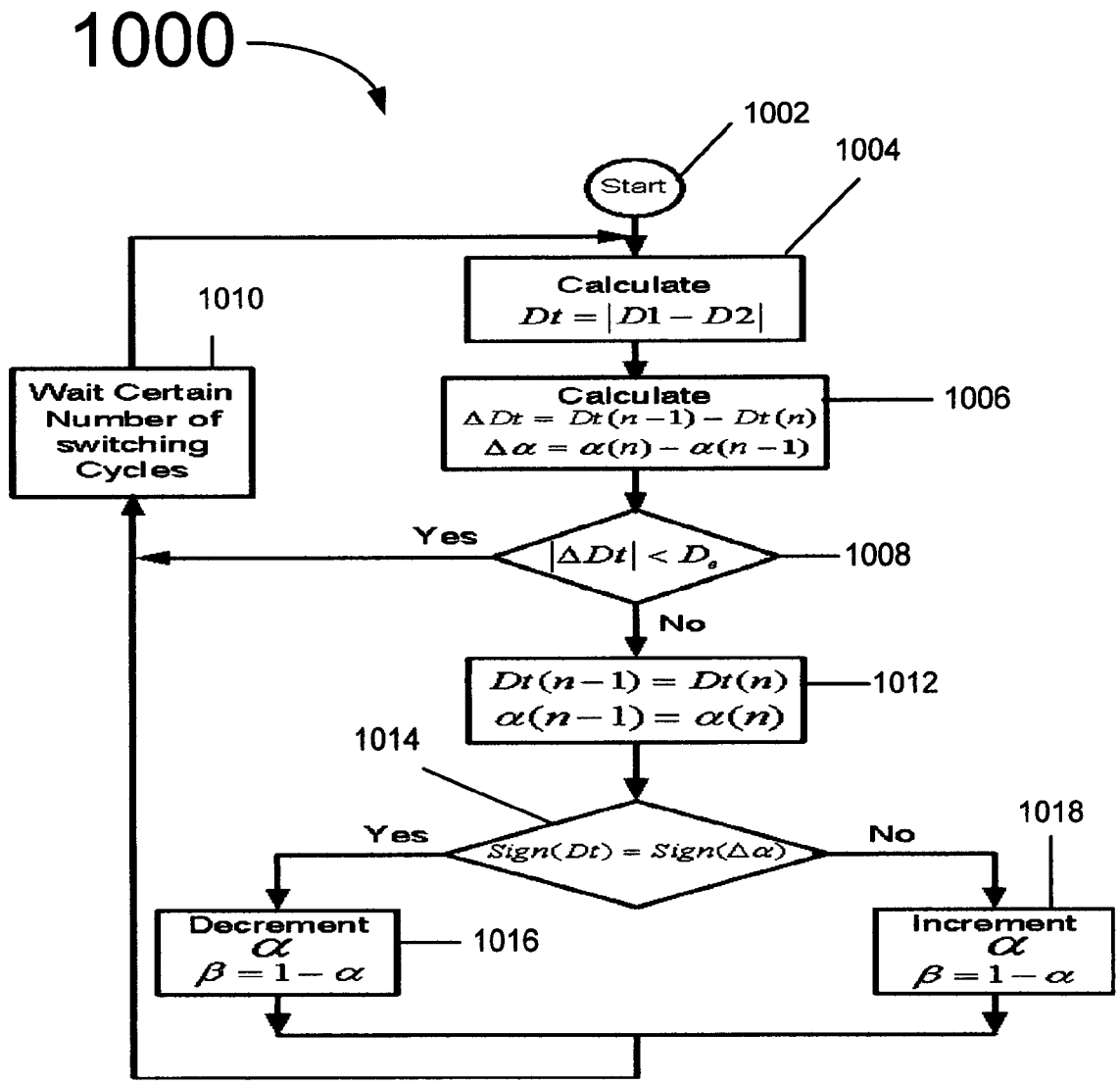
FIG. 10 illustrates a flow chart according to some embodiments of the inventions.

FIG. 10 illustrates a flow 1000 for a sensor less current sharing implementation according to some embodiments. The current sharing ratio between phases is adjusted by incrementing and decrementing $\alpha$ and $\beta$ to track the current sharing ratio that will result in a minimum duty cycles' difference (which is not zero according to some embodiments and as will be described herein). Flow 1000 starts at 1002. A calculation is made at 1004 of a value D t, which in some embodiments can be an absolute value of the difference between the phase 1 duty cycle D1 and the phase 2 duty cycle D2. According to some embodiments, the calculation of Dt at 1004 may be implemented as follows: Dt=D1−D2. According to some embodiments, the calculation of Dt at 1004 may be implemented as follows: According to some embodiments, the calculation of Dt at 1004 may be implemented as follows: ΔDt=D1+D2. According to some embodiments the calculation at 1004 may be implemented and/or changed depending on topology and/or definition. A change in D t value is calculated at 1006. According to some embodiments, the calculation at 1006 of delta Dt may be calculated as being Dt(n)−Dt(n−1). According to some embodiments, the calculation of delta Dt at 1006 may calculated as Dt(n−1)−Dt(n). According to some embodiments the calculation at 1006 may be implemented and/or changed depending on topology and/or definition. A determination is made at 1008 as to whether an absolute value of the change in D t value is less than a value D e. If the answer at 1008 is "yes" then flow moves to wait a certain number of switching cycles at 1010. If the answer at 1008 is "no" then flow moves to 1012. At 1012 the D t value and the alpha value are updated. Then at 1014 a determination is made as to whether a sign of the change in the current value of I is equal to a sign of the change in alpha. If the answer at 1014 is "yes", then alpha is decremented at 1016. If the answer at 1014 is "no", then alpha is incremented at 1018. Then flow moves to box 1010 to wait a certain number of switching cycles.

There is more than one possible scheme of how the proposed concept can be used with N-Phases (more than two), one of them will be briefly presented in this paper (more focus will be included in future publications).

Figure 11:
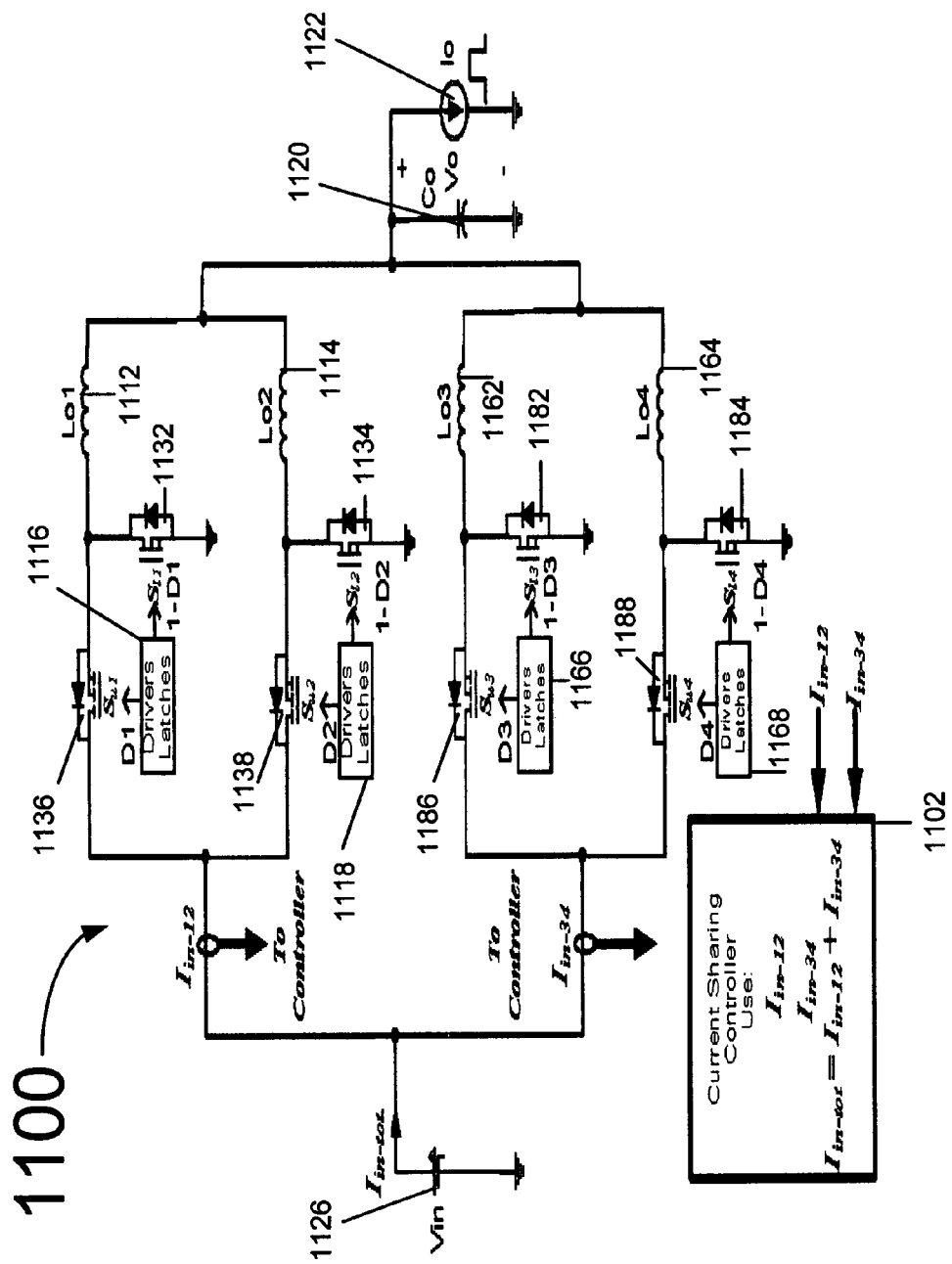
FIG. 11 illustrates a circuit according to some embodiments of the inventions.

FIG. 11 illustrates a four phase buck converter 1100. Conversion circuitry (power conversion circuitry) 1100 includes a four phase buck converter, and has similar operation to FIG. 8, but includes four phases. Circuit 1000 includes 1136, 1132, 1116, 1112, 1138, 1134, 1114, 1186, 1182, 1162, 1166, 1188, 1184, 1164, and 1168. The four phase power stage receives power from a power source 1126 and supplies regulated energy to load 1122 that is held by the output capacitor 1120.

The current sharing controller 1102, which according to some embodiments, utilizes one or more algorithms that have been described elsewhere herein, senses the input current information coming from the source 1126 and performs an algorithm to minimize the input current and input power from the source to achieve an optimum current sharing ratio.

FIG. 11 illustrates a four phase buck converter 1100 to be used to explain a current sharing implementation (generalization) for N-phases according to some embodiments. The input currents, $I_{in-12}$ and $I_{in-34}$ for each two phases of the four are sensed and fed back to the current sharing controller which uses these sensed currents to also calculate the total input current $I_{in-tot.}=I_{in-12}+I_{in-34}$. According to some embodiments it may be assumed that the CSC or/and sensor gains are assigned as follows: $\delta_1 \cdot \delta_{12}$, $\delta_2 \cdot \delta_{12}$, $\delta_3 \cdot \delta_{34}$, and $\delta_4 \cdot \delta_{34}$. The current sharing loop is executed periodically in two stages. In the first stage, only $\delta_{12}$ and $\delta_{34}$ are adjusted based on $I_{in-tot.}=I_{in-13}+I_{in-34}$ using an algorithm (for example, according to some embodiments, the same as and/or similar to the one illustrated in FIG. 6) to guarantee optimized current sharing between phase 1 plus phase 2 and phase 3 plus phase 4. In the second stage and in two independent loops/algorithms (for example, in some embodiments, similar to that shown in FIG. 6), $\delta_1$ and $\delta_2$ are adjusted based on $I_{in-12}$ to guarantee optimized current sharing between phase 1 and phase 2, and $\delta_3$ and $\delta_4$ are adjusted based on $I_{in-34}$ to guarantee optimized current sharing between phase 3 and phase 4. Through this method, and according to some embodiments, current sharing and/or sensing calibration are achieved between all phases. Also, this method can apply for any odd or even number of phases.

The aforementioned scheme provides a simple approach according to some embodiments. However, other schemes may be used, such as those that perform a search using all CSCs while only looking into the total input current ($I_{in-tot}$) minimum point with no need to sense each two phase input current ($I_{in-12}$ and $I_{in-34}$). This allows the need only to sense one total input current, but may result in a more complicated tracking algorithm of the CSCs.

A current sharing sensor less implementation according to some embodiments may be implemented through a similar process.

Figure 12:
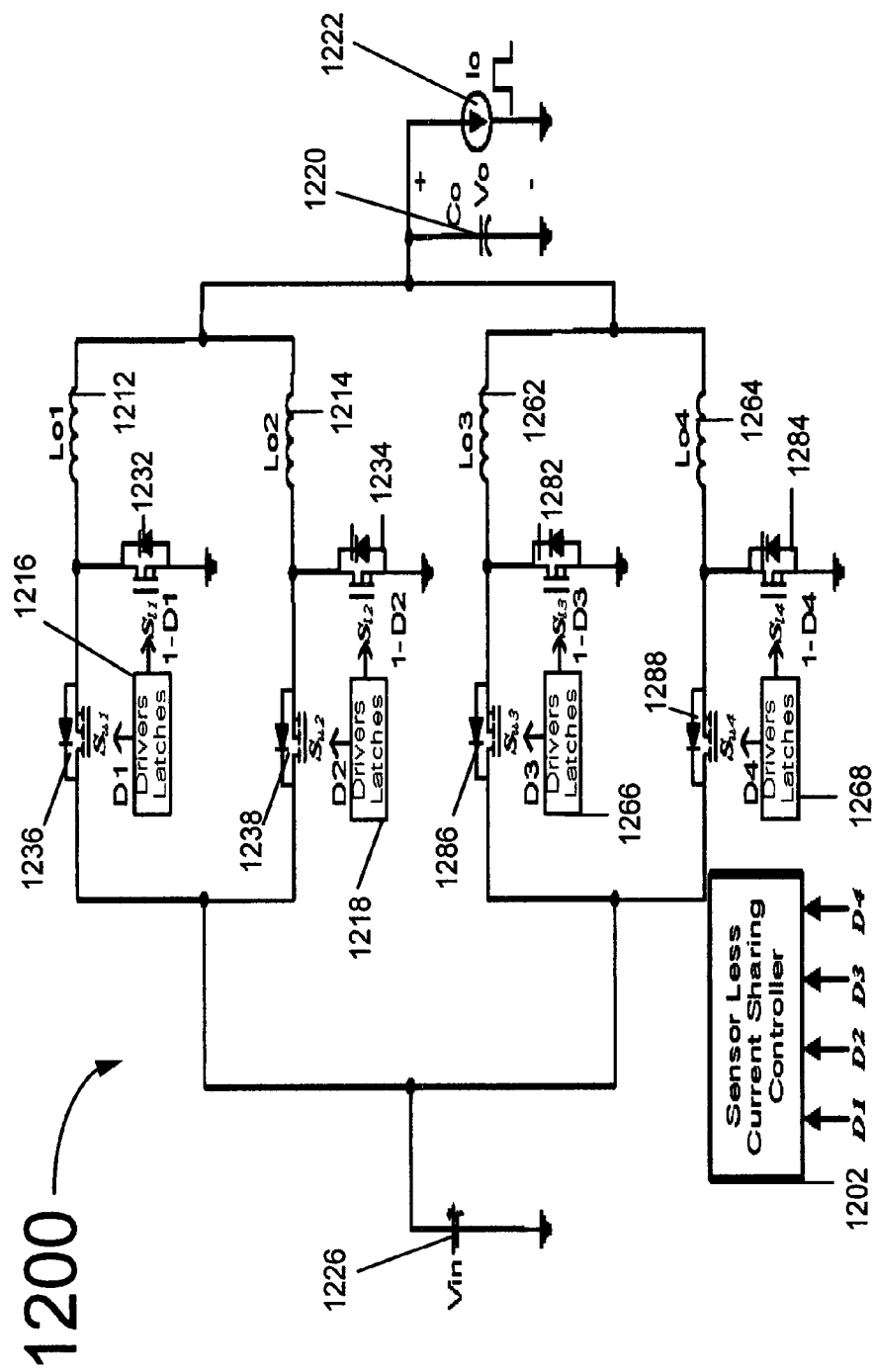
FIG. 12 illustrates a circuit according to some embodiments of the inventions.

FIG. 12 illustrates a four phase buck converter 1200 and has similar operation to FIG. 8, but with four phases. Converter 1200 includes a current sharing controller 1202 as well as elements 1236, 1232, 1216, 1218, 1238, 1234, 1214, 1286, 1282, and 1262. The four phase power stage 1200 receives power from a power source 1226 and supplies regulated energy to load 1222 that is held by the output capacitor 1220. The current sharing controller 1202, which according to some embodiments utilizes algorithms that are described herein, utilizes information of each phase duty cycle to perform current sharing with no need to sense additional signals.

FIG. 12 illustrates a four phase buck converter 1200 according to some embodiments to be used to explain a current sharing concept generalization for N-phases according to some embodiments. A similar algorithm as the one shown in FIG. 10 can be used to find the minimum point of $Dt_{12}=|D1−D2|$ to optimize CSR between Phase 1 and Phase 2, and can be used to find the minimum point of $Dt_{34}=|D3−D4|$ to optimize CSR between Phase 3 and Phase 4. At the same time, a similar algorithm may be used to find the minimum point of $Dt_{1234}=|Dt_{12}−Dt_{34}|$. Also, other search schemes can be used according to some embodiments.

According to some embodiments the value $D_e$ is an optional threshold that can be used to stop the tracking process if the change in the duty cycles' difference is not sufficient to change α and β.

Current sharing concepts and schemes (such as those described above) may be used according to some embodiments along with conventional current sharing and sensing schemes for online lossless calibration. A current sharing scheme may be used such as the one shown in FIG. 7, while another current sharing scheme may be utilized to adjust the sensing gains K1 and/or K2 to calibrate the sensed information. This calibration is lossless, can be performed without converter operation interruption, and does not require human interaction. The activation of such calibration can run periodically during the converter operation (no need to run continuously) or/and can run at the beginning of the converter operation, for example, according to some embodiments. According to some embodiments current sensing schemes may be used which are immune to and not affected by sensing accuracy, and the current sharing loop can be calibrated accurately.

According to some embodiments a two-phase buck power stage may be implemented with a digital closed loop controller. For example, the hardware description may be implemented according to some embodiments as follows:

Power Stage:
    Two-Phase Buck, $V_{in}$=12V, $V_o$=0.84V.
    Output Inductor: $L_{o1}=L_{o2}$=315 nH per phase.
    Output Capacitors: 560 μF×10 aluminum polymers and 22 μF×18 is ceramic.

Upper FET: NTD40N03R, two in parallel.
Lower FET: NTD85N02R, two in parallel.
FETs Driver: AD13418K, 12V.
Switching frequency: $f_{sw}$=300 kHz per phase.
Digital Controller:
FPGA part: Xilinx Virtex 4.
Output Voltage ADC: ADI9215, 10-bit, 30M sample/sec.
Input Current ADC: 12-bit 100 k sample/sec.
Voltage Closed Loop: Type III Compensation
DPWM: 13-bits custom silicon.

According to some embodiments the design of the power stage is intended to be as symmetric as possible. For example, the flowchart of FIG. 9 may be utilized in a first experiment and the flowchart of FIG. 10 may be utilized in a second experiment.

Running both experiments with fully closed loop of the voltage loop and the proposed current sharing loop for the two proposed concepts, the digital controller converges to the following values for the highest power efficiency: α=51% and β=49% that occurs when $D_1$=14.35% and $D_2$=14.27% at $I_{in}$=1.997A when $I_o$=23 A.

Figure 13:
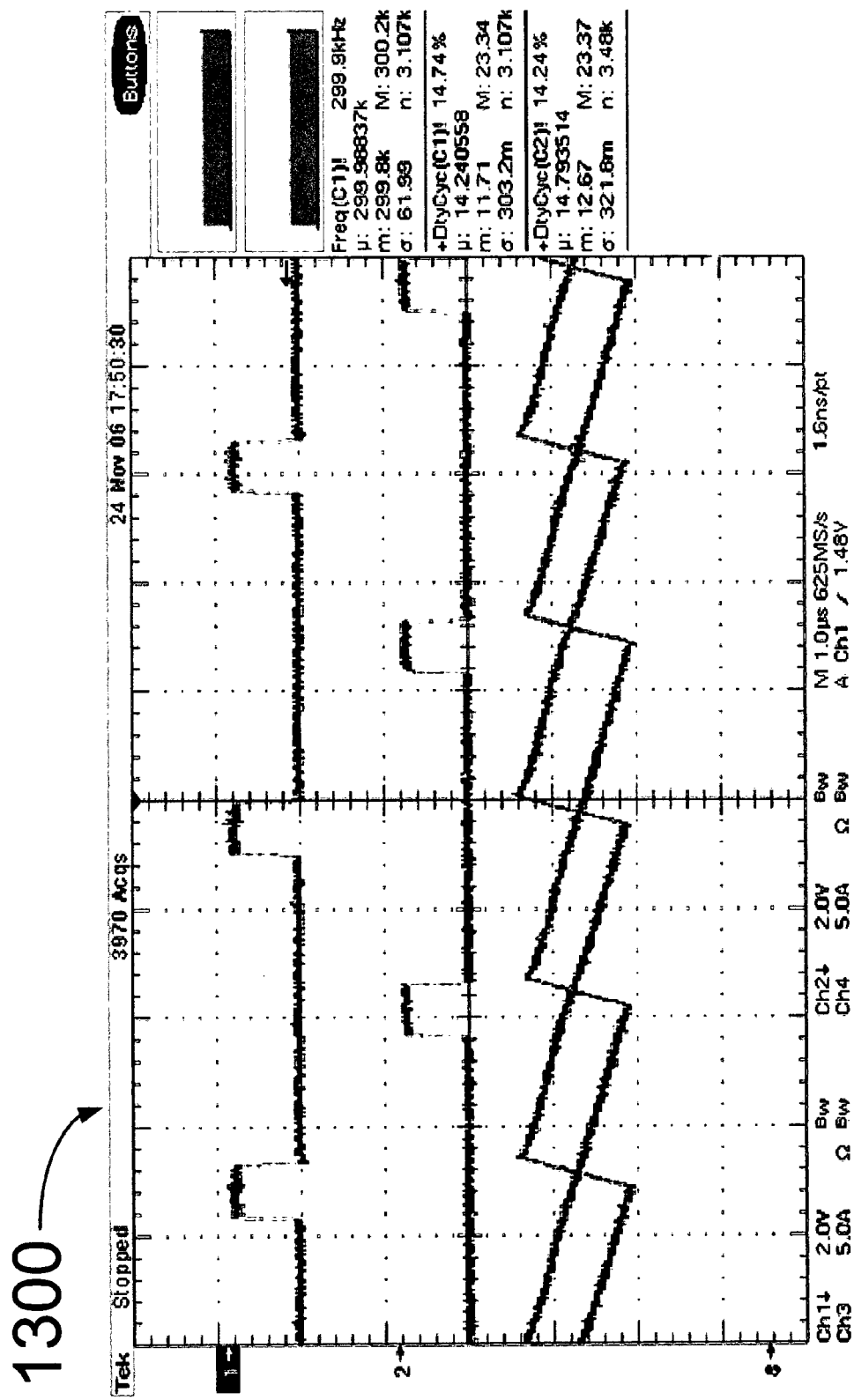
FIG. 13 illustrates a waveform according to some embodiments of the inventions.
Figure 14:
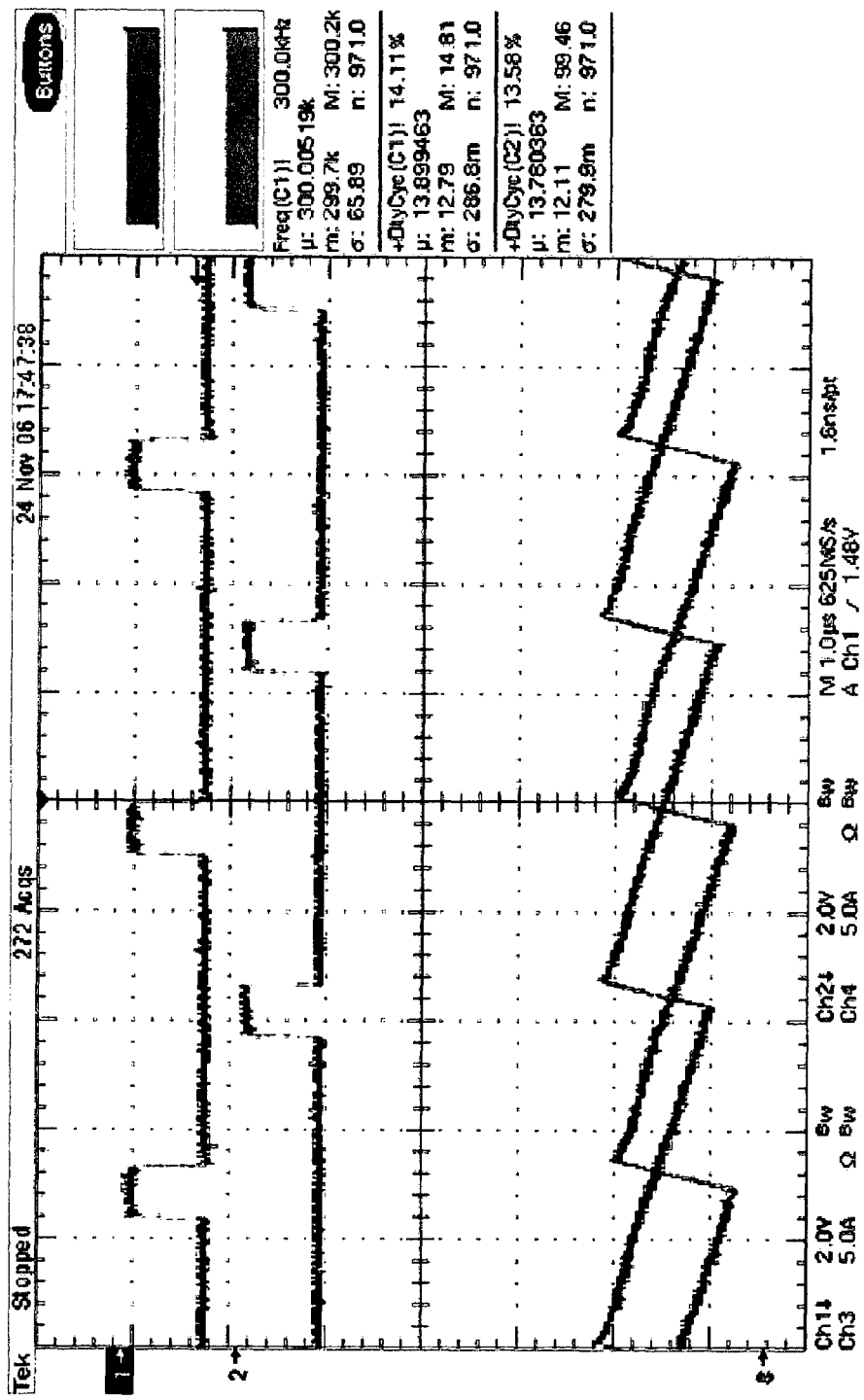
FIG. 14 illustrates a waveform according to some embodiments of the inventions.
Figure 15:
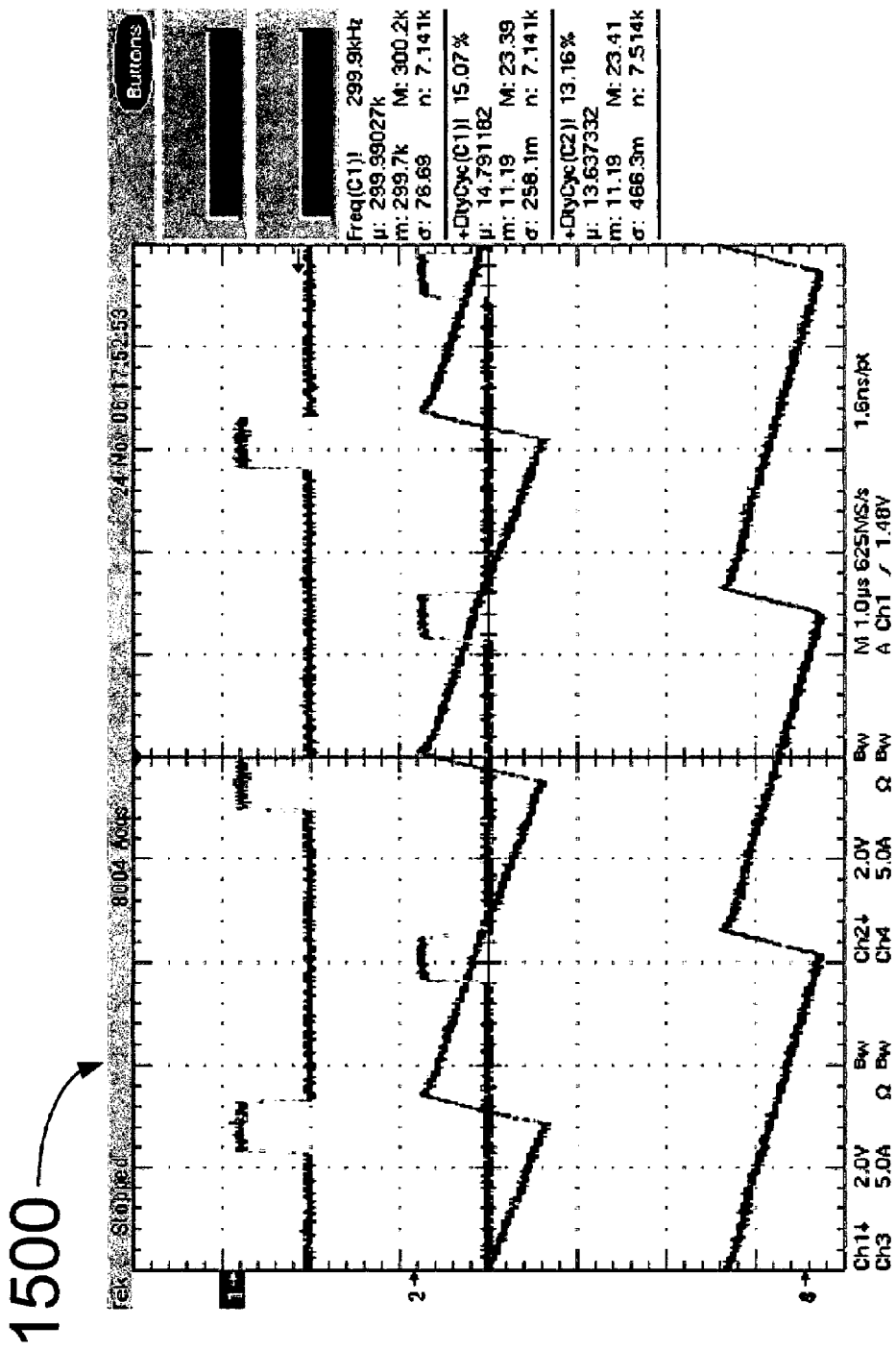
FIG. 15 illustrates a waveform according to some embodiments of the inventions.
Figure 16:
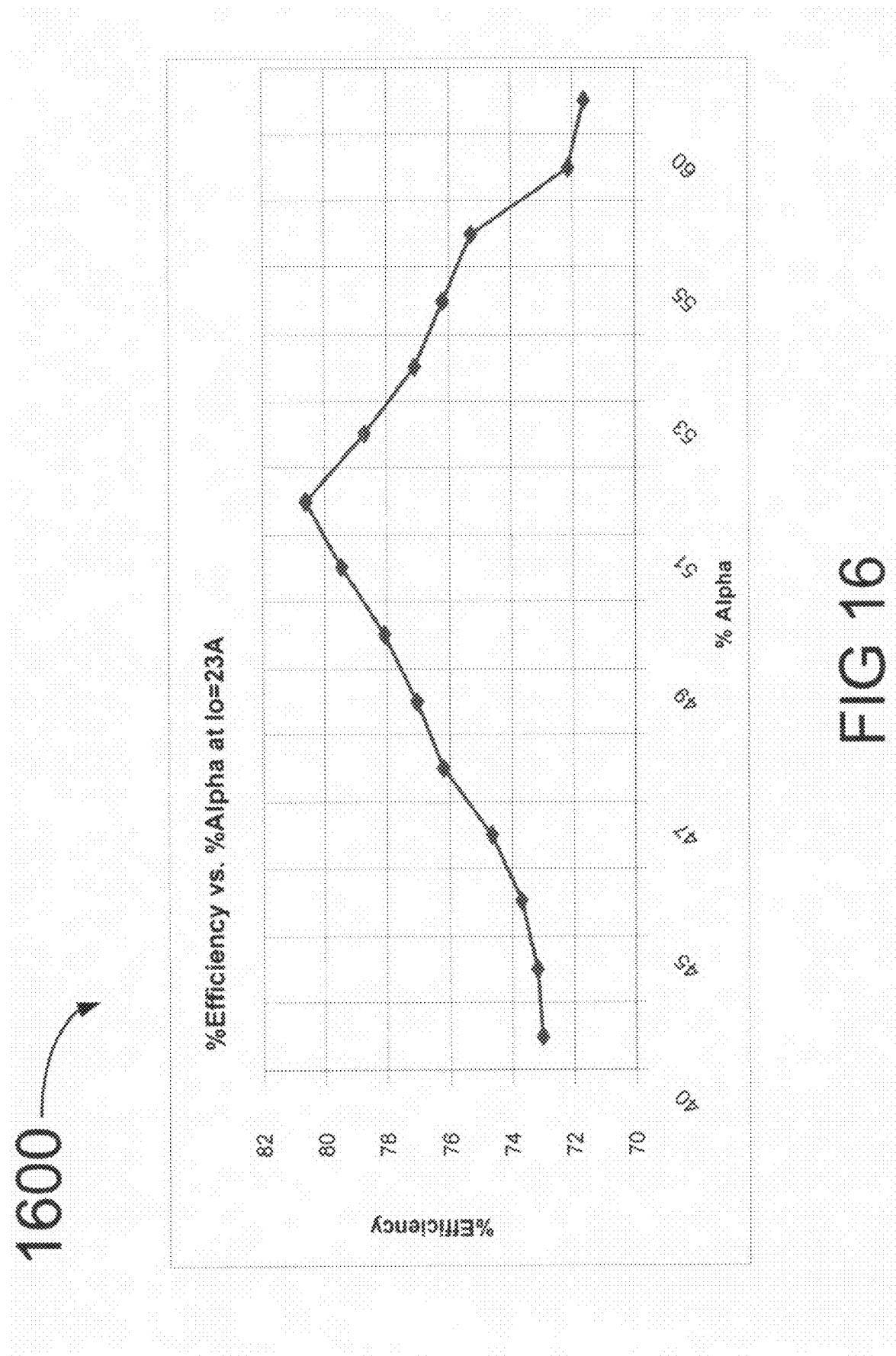
FIG. 16 illustrates a waveform according to some embodiments of the inventions.
Figure 17:
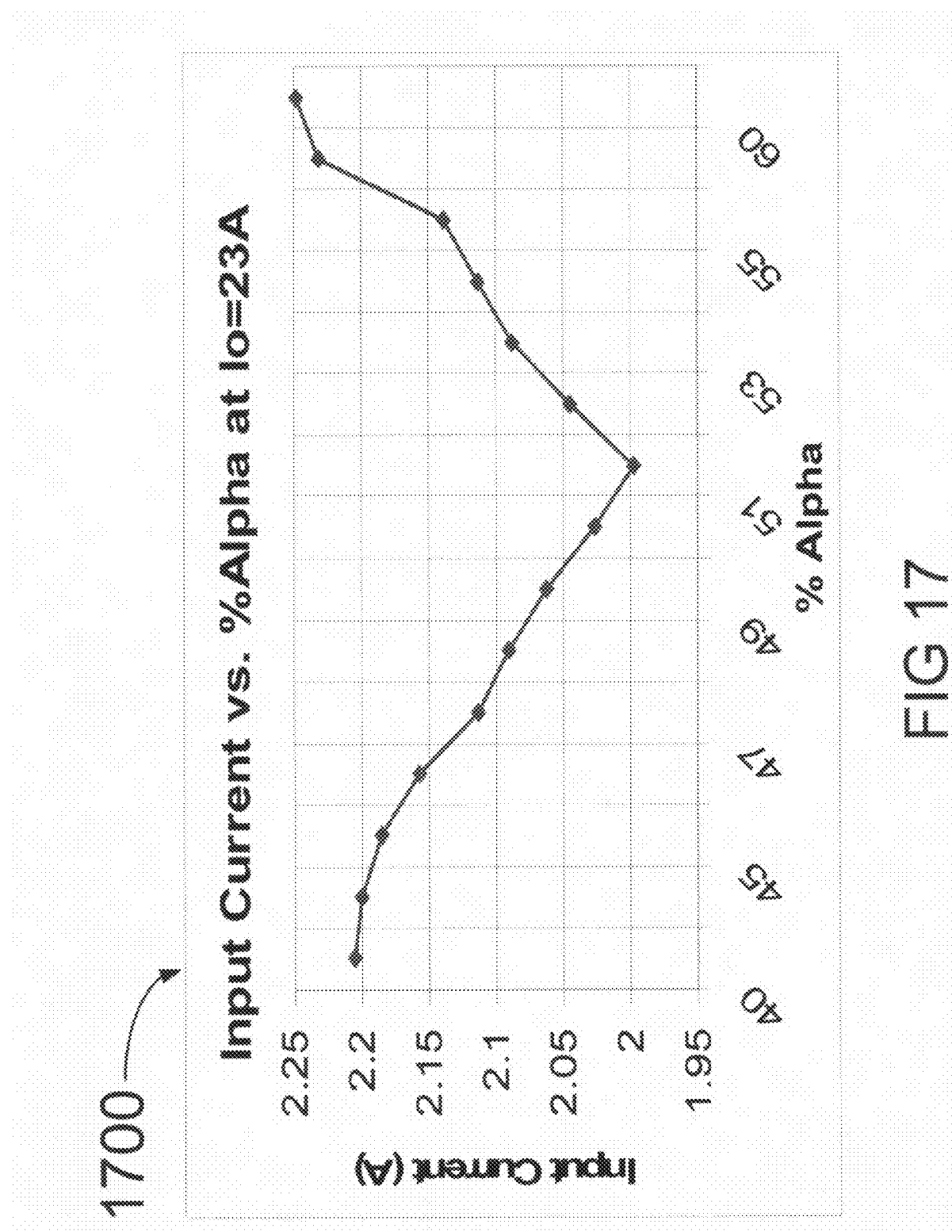
FIG. 17 illustrates a waveform according to some embodiments of the inventions.
Figure 18:
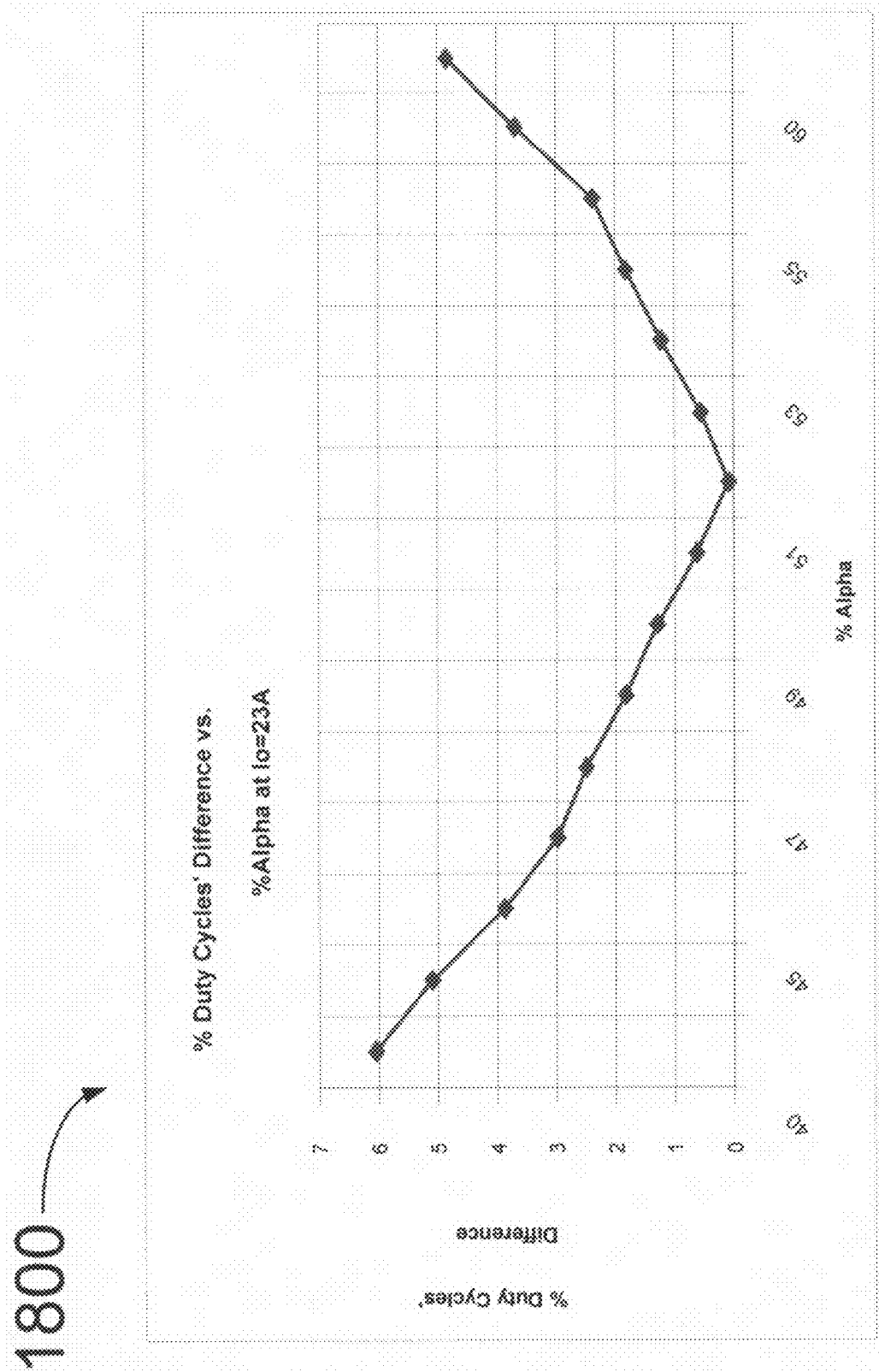
FIG. 18 illustrates a waveform according to some embodiments of the inventions.
Figure 19:
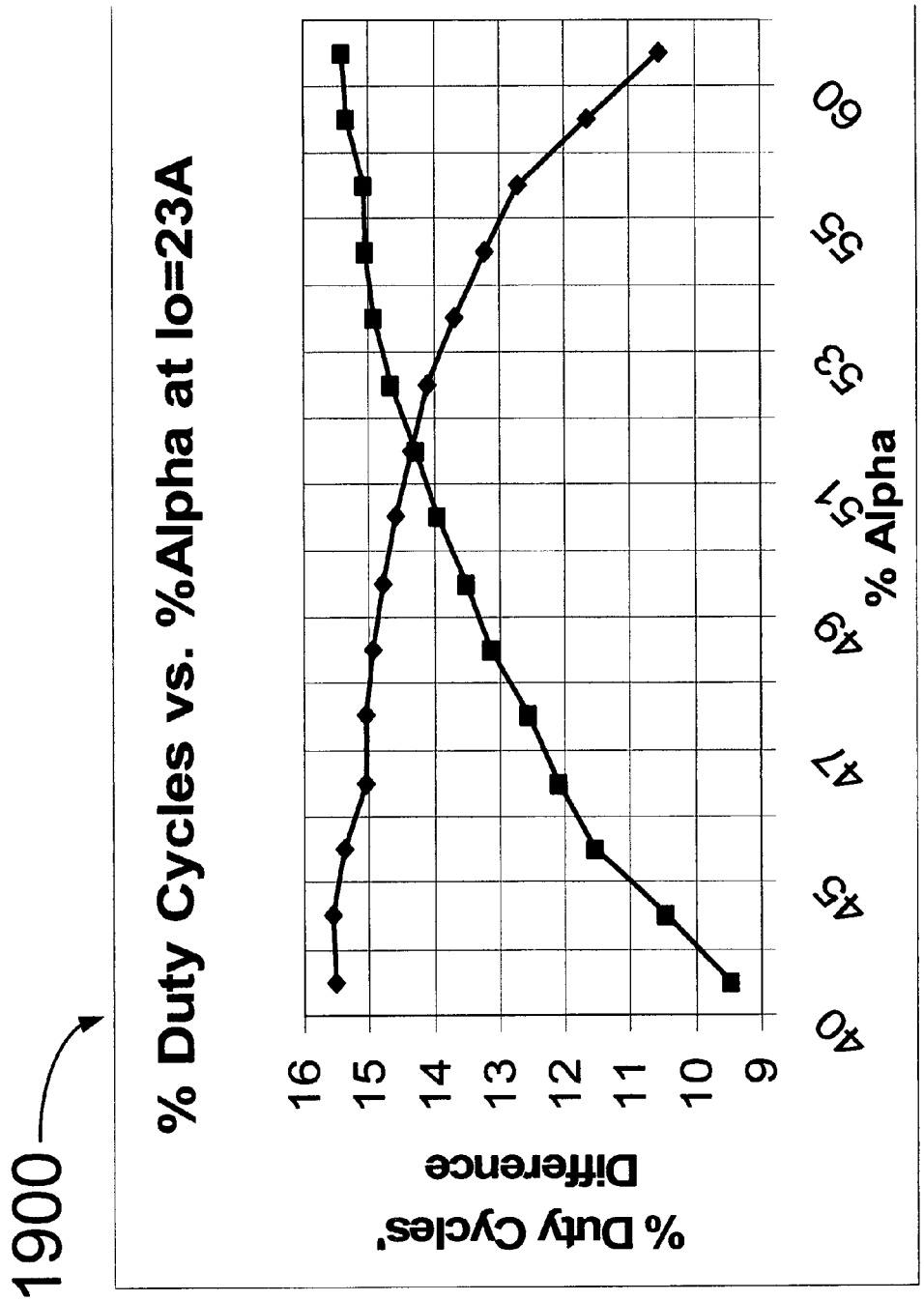
FIG. 19 illustrates a waveform according to some embodiments of the inventions.

FIGS. 13-15 illustrate experimental waveforms 1300, 1400 and 1500 for phases' DPWM (Duty Cycles) and inductor currents while conversion to the optimum %CSR. FIG. 13 illustrates the waveforms 1300 of each phase DPWM and inductor current at $I_o$=23 A—closed loop. FIG. 14 illustrates the waveforms 1400 at $I_o$=10 A—closed loop.

FIG. 15 illustrates the waveforms 1500 when the current sharing loop is disabled, which causes one phase to carry most of the output current.

FIGS. 16, 17, 18 and 19 illustrate the Efficiency 1600, input current 1700, duty cycles' difference 1800, and phases' duty cycles 1900 as a function of the %α, respectively. These results agree with results previously discussed herein, where the optimum current sharing ratio exists at the minimum input current point and the minimum difference between duty cycles for maximum efficiency.

According to some embodiments novel current sharing concepts may be used that include several advantages over conventional schemes, including the immunity against sensing inaccuracies and the need for no offline or online calibration. There is no need to sense each phase current which potentially reduces the number of components and size. Current sharing may be based on achieving optimum efficiency and not just achieving certain current sharing ratio, and can be used independently to achieve current sharing or can be used in conjunction with other schemes to achieve lossless online calibration functionality. According to some embodiments a sensor less implementation for current sharing may be used that does not require additional current sensing.

Figure 20:
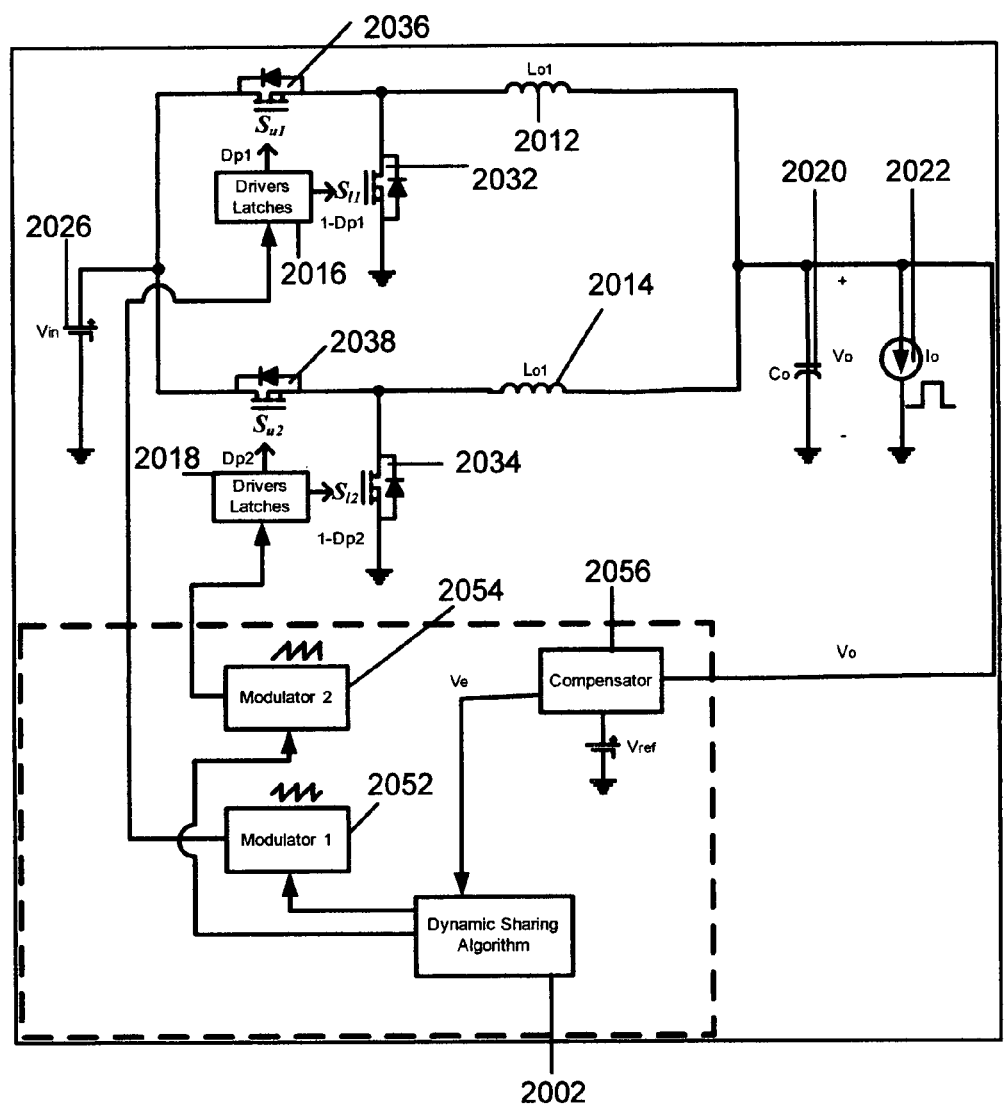
FIG. 20 illustrates a circuit according to some embodiments of the inventions.

FIG. 20 illustrates a current sharing implementation 2000 according to some embodiments. Implementation 2000 includes a dynamic sharing algorithm 2002. Dynamic sharing 2002 may be implemented, for example, internally to the controller of the power converter. Thus, according to some embodiments, no extra sense elements are necessary. According to some embodiments current sharing implementation 2000 can be similar to the current sharing implementation 800 of FIG. 8. According to some embodiments current sharing circuit 2000 is a two-phase power stage, for example, that is controlled by a controller 2002 to process the energy from source 2026 to the load 2022. The controller 2002 senses the output voltage Vo and feeds it to the closed loop compensator of element 2056 that will generate the required switches command error voltage Ve required to regulate the energy at the output/load. Ve is utilized by the dynamic current sharing element 2002 that performs algorithms/flowcharts according to some embodiments (for example, as indicated in flowcharts such as those illustrated in FIG. 9 and FIG. 10 that utilize duty cycle information and not input current) to generate the required duty cycle for each of the phases that will result in required current sharing of load current between phases. Elements 2054 and 2052 are modulators used to translate commands from controller 2002 into a signal that is pulse width modulated and can drive the power stage drivers and switches of the circuit 2000 of FIG. 20.

Figure 21:
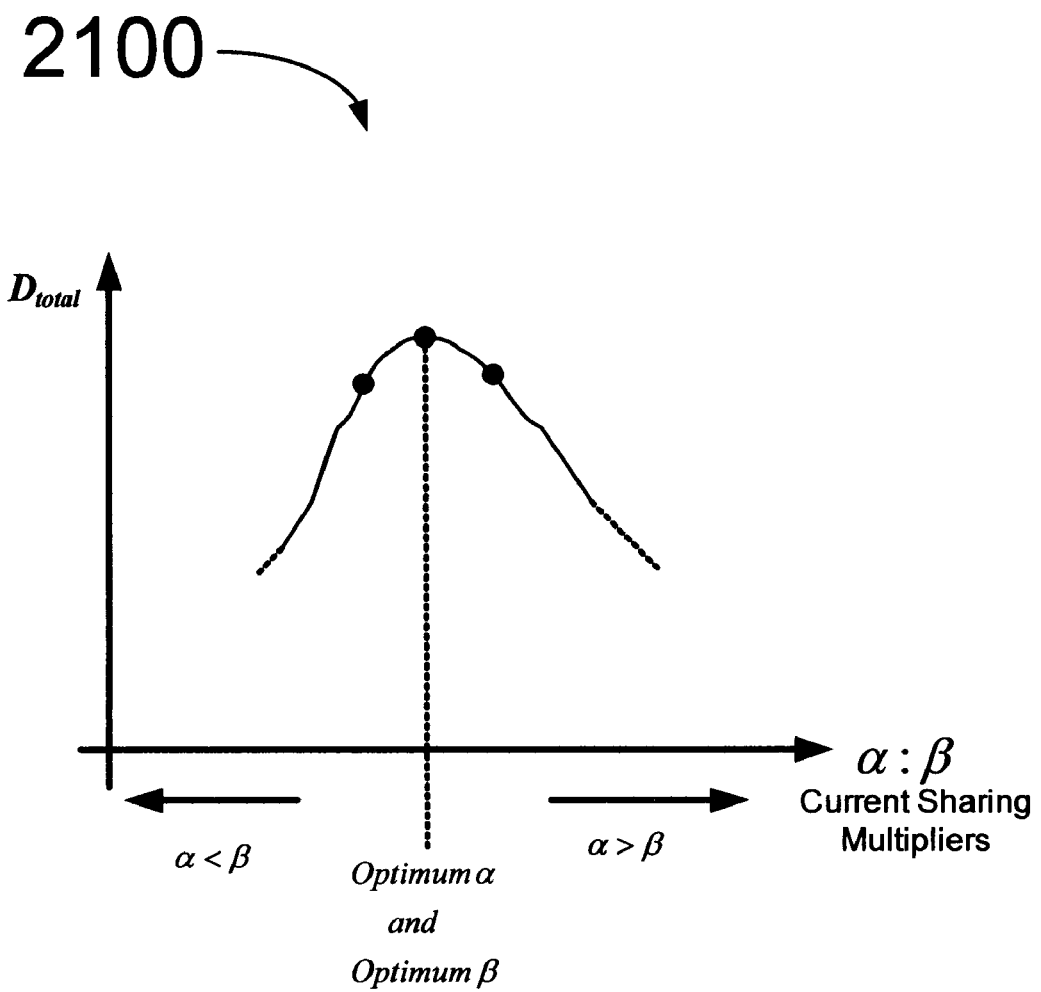
FIG. 21 illustrates a waveform according to some embodiments of the inventions.
Figure 22:
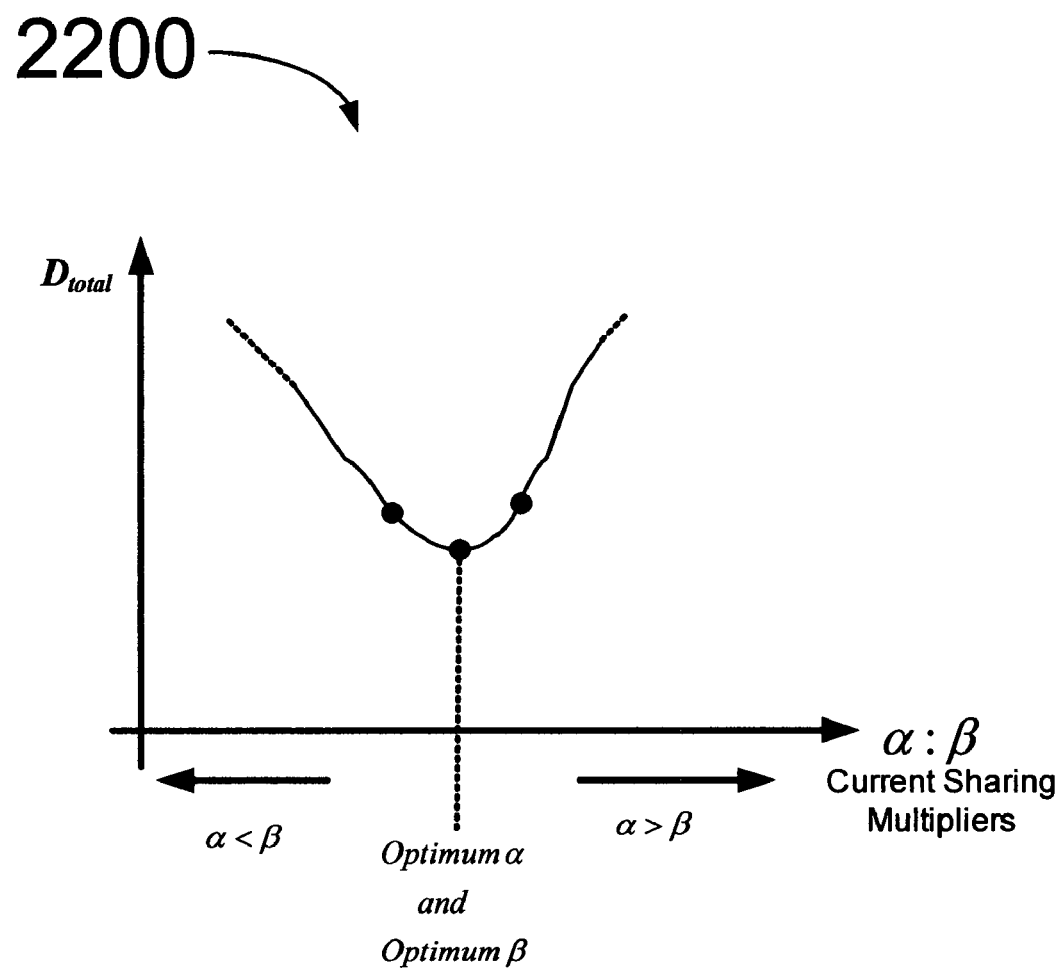
FIG. 22 illustrates a waveform according to some embodiments of the inventions.
Figure 23:
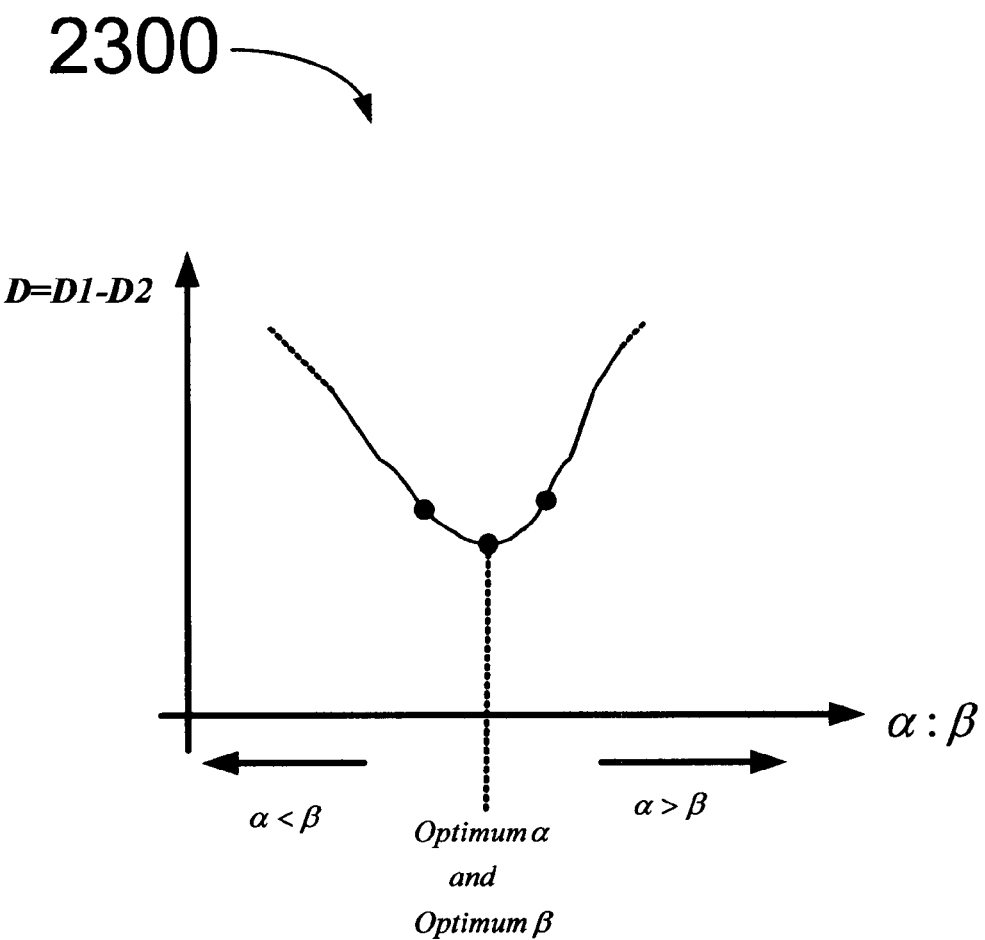
FIG. 23 illustrates a waveform according to some embodiments of the inventions.

FIGS. 21-23 illustrate waveforms 2100, 2200 and 2300 which show tracking the maximum and/or minimum duty cycle summation.

Figure 24:
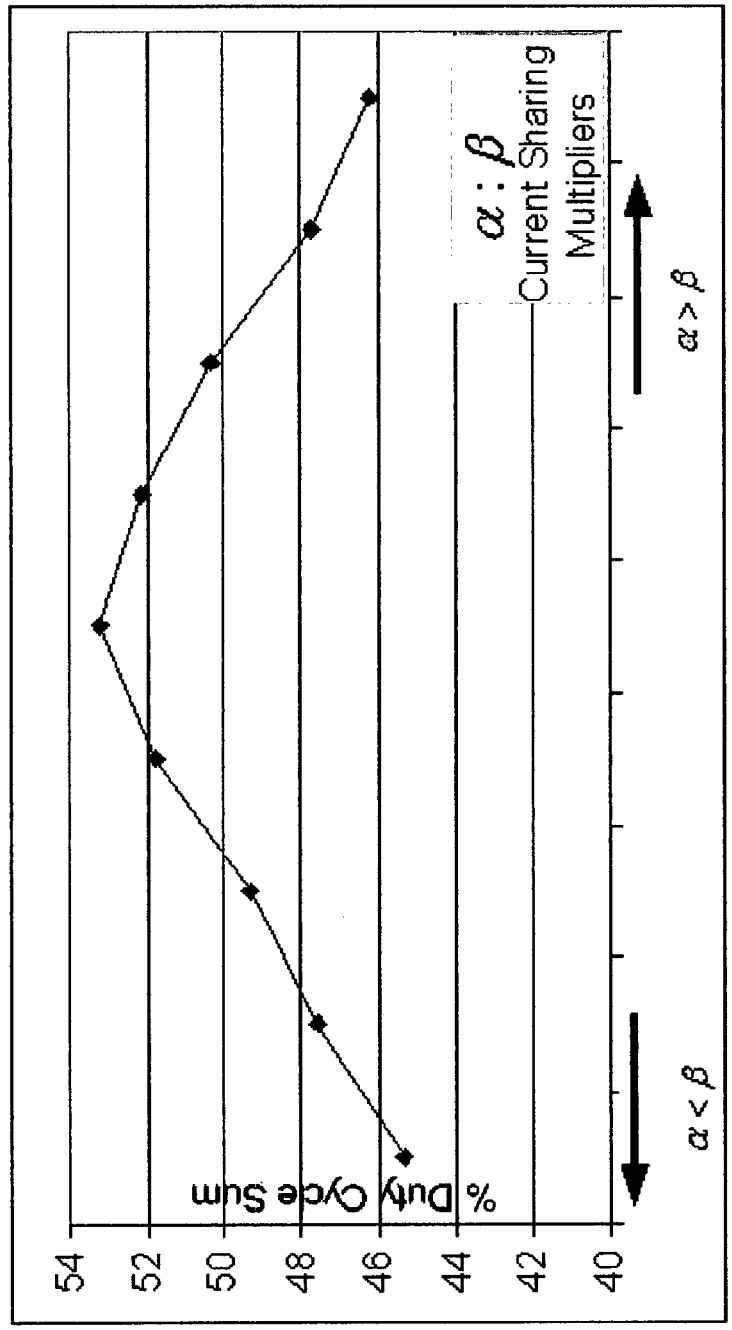
FIG. 24 illustrates a waveform according to some embodiments of the inventions.

FIG. 24 illustrates sample experimental data 2400 of how this scheme is able to track optimum current sharing using only the duty cycle summation for a case in which two phases are to be matched. This may be implemented using a digital control algorithm.

As used herein, α and β are the duty cycle multipliers of duty cycles $D_1$ and $D_2$ respectively, where $D_1$=α·$V_e$ and $D_2$=⊕·$V_e$, for example. These variables are used to adjust the current sharing ratio between phases. The Ve signal may be further defined as shown in the Figures and based on the description herein.

According to some embodiments, power conversion efficiency is dynamically tracked and optimized. According to some embodiments current sharing among different phases in a multiple phase converter is calibrated without using current sensors and/or sensing circuitry. According to some embodiments, current sharing is applicable to any designs of power stages of converters and/or inverters.

Although some embodiments herein have been described as utilizing, for example, a buck topology power stage, some embodiments relate to and can be applied to any power stage. Additionally, although some exemplary circuits have been presented herein, these circuits are examples, and the flowcharts and/or algorithms, etc. discussed herein can be applied to many different circuits.

According to some embodiments, a maximum efficiency and performance may be achieved (for example, for future Intel platforms). According to some embodiments, on board power delivery and on-package and/or integrated on-die VRs (voltage regulators) may be implemented. According to some embodiments, implementations may be made in silicon such as a chipset or a processor, for example. Such implementations can result in reduced component count, size, lower cost, better current sharing loop and stability, potentially better efficiency, and can protect against component variation and aging effects. This is very important, for example, to the integrated power stages.

According to some embodiments, multiphase converters may be widely used in platforms such as desktop, mobile, and/or server implementations. According to some embodiments, multiphase converters may be used in on-board VRs, on-package VRs, and Integrated VRs.

According to some embodiments, the implementations according to the inventions may be based on aggressive platform optimization, and power efficiency and optimization of performance and improved controller integration. According to some embodiments, such an approach may be applied for an integrated VR controller, for example, a digital VR controller integrated on a microprocessor. According to some embodiments, implementations may be used System on a Chip systems and/or Integrated VRs.

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A method for sharing current among multiple phases in a power stage of a power conversion device, comprising:
    tracking input power of the power stage, wherein the tracking is performed using one or more input sensors;
    adaptively adjusting a duty cycle of each of the multiple phases until a minimum input power is obtained for the power stage at a duty cycle setting, the duty cycles being adjusted by changing settings of a plurality of switches for the multiple phases, wherein the adjustment in duty cycles changes current sharing between the multiple phases; and
    setting the duty cycles of the phases to be the duty cycle value that corresponds to the minimum input power required to deliver power to the multiple phases.

2. The method of claim 1, wherein tracking the input power comprises sensing an input current with the one or more input sensors and digitizing the sensed input current.

3. The method of claim 2, further comprising:
    determining whether the input current is equal to or larger than a predetermined maximum value; and
    if the input current is equal to or larger than the predetermined maximum value, performing protection action to reduce the input current.

4. The method of claim 1, wherein adaptively adjusting duty cycles of the multiple phases comprises:
    obtaining a total duty cycle from a controller in the power stage;
    initializing a set of current sharing coefficients for the multiple phases in the power stage; and
    deriving the duty cycles for the multiple phases from the total duty cycle and the current sharing coefficients.

5. The method of claim 4, wherein adaptively changing duty cycles of the multiple phases further comprises:
    adjusting values of the current sharing coefficients, wherein the sum of the values equals and remains a constant;
    obtaining the current value of the total duty cycle from the digital controller; and
    updating the duty cycles of the multiple phases based on the updated value of the total duty cycle and the updated values of the current sharing coefficients.

6. The method of claim 5, wherein adaptively changing duty cycles of the multiple phases further comprises:
    obtaining an input power after the updated duty cycles of the multiple phases are used;

determining whether the input power decreases by a predetermined degree with the updated duty cycles for the multiple phases; and if the input power does not decrease by the predetermined degree, adaptively adjusting the value of the current sharing coefficients and further updating the duty cycles until the input power decreases by the predetermined degree.

7. The method of claim 1, wherein the adaptive adjustment of the duty cycles of the multiple phases is performed to maximize an efficiency of the power stage.

8. The method of claim 1, further comprising adaptively adjusting duty cycles of multiple phases in a plurality of stages, wherein the multiple phases are grouped into two groups in a first stage of the plurality of stages; and wherein the phases in each group in the first stage are sub-grouped into two sub-groups in a second stage of the plurality of stages.

9. The method of claim 1, wherein the power stage is a power converter.

10. An apparatus for sharing current among multiple phases in a power stage of a power conversion device comprising:

at least two phases in the power stage, each phase supplying power to a load;

one or more input sensors to track input power of the power stage; and a digital controller to enforce a current sharing scheme between the at least two phases, the digital controller to adaptively change duty cycles for the at least two phases until a minimum value of an input power is achieved for the power stage at a duty cycle setting, the duty cycles being adjusted by changing settings of a plurality of switches for the multiple phases, wherein the adjustment in duty cycles changes current sharing between the multiple phases, the digital controller to set the duty cycles of the phases to be the duty cycle setting that corresponds to the minimum input power.

11. The apparatus of claim 10, further comprising:

an analog-to-digital converter (ADC) to digitize the sensed input current and to provide the digitized input current to the digital controller for computing the input power.

12. The apparatus of claim 10, wherein the digital controller adaptively changes the duty cycles of the multiple phases by:

obtaining a total duty cycle of the power stage;

initializing a set of current sharing coefficients for the multiple phases in the power stage;

deriving the duty cycles for the multiple phases from the total duty cycle and the current sharing coefficients;

adjusting values of the current sharing coefficients, wherein the sum of the values equals and remains a constant;

obtaining the current value of the total duty cycle; and updating the duty cycles of the multiple phases based on the updated value of the total duty cycle and the updated values of the current sharing coefficients.

13. The apparatus of claim 12, wherein the digital controller adaptively changes the duty cycles of the multiple phases by further:

obtaining an input power after the updated duty cycles of the multiple phases are used;

determining whether the input power decreases to a predetermined degree with the updated duty cycles for the multiple phases; and if the input power does not decrease to the predetermined degree, adaptively adjusting the value of the current sharing coefficients and further updating the duty cycles until the input power decreases to the predetermined degree.

14. The apparatus of claim 10, wherein the digital controller performs adaptive change to the duty cycles of multiple phases in a plurality of stages, wherein the multiple phases are grouped into two groups in a first stage of the plurality of stages; and wherein the phases in each group in the first stage are sub-grouped into two sub-groups in a second stage of the plurality of stages.

15. The apparatus of claim 10, wherein the power stage is a power converter.

16. The method of claim 1, wherein the multiple phases comprise parallel modules in the power stage.

17. The apparatus of claim 10, wherein the multiple phases comprise parallel modules in the power stage.

* * * * *